United States Patent
Kim et al.

(10) Patent No.: US 10,388,629 B2
(45) Date of Patent: Aug. 20, 2019

(54) SEMICONDUCTOR DEVICE

(71) Applicant: Samsung Electronics Co., Ltd., Suwon-si, Gyeonggi-do (KR)

(72) Inventors: Daeshik Kim, Hwaseong-si (KR); Gwanhyeob Koh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 5 days.

(21) Appl. No.: 15/718,535

(22) Filed: Sep. 28, 2017

(65) Prior Publication Data
US 2018/0277517 A1    Sep. 27, 2018

(30) Foreign Application Priority Data

Mar. 27, 2017    (KR) .................. 10-2017-0038650

(51) Int. Cl.
| | |
|---|---|
| *H01L 25/065* | (2006.01) |
| *H01L 43/08* | (2006.01) |
| *H01L 23/522* | (2006.01) |
| *H01L 27/22* | (2006.01) |
| *H01L 25/00* | (2006.01) |
| *H01L 23/00* | (2006.01) |

(52) U.S. Cl.
CPC ...... *H01L 25/0657* (2013.01); *H01L 23/5226* (2013.01); *H01L 25/50* (2013.01); *H01L 27/228* (2013.01); *H01L 43/08* (2013.01); *H01L 24/13* (2013.01); *H01L 24/16* (2013.01); *H01L 24/17* (2013.01); *H01L 24/29* (2013.01); *H01L 24/32* (2013.01); *H01L 24/48* (2013.01); *H01L 2224/0401* (2013.01); *H01L 2224/04042* (2013.01); *H01L 2224/08145* (2013.01); *H01L 2224/131* (2013.01); *H01L 2224/16145* (2013.01); *H01L 2224/16227* (2013.01); *H01L 2224/17181* (2013.01); *H01L 2224/2919* (2013.01); *H01L 2224/32225* (2013.01); *H01L 2224/48091* (2013.01); *H01L 2224/48227* (2013.01); *H01L 2224/94* (2013.01); *H01L 2225/0651* (2013.01); *H01L 2225/06513* (2013.01); *H01L 2225/06517* (2013.01); *H01L 2225/06524* (2013.01); *H01L 2225/06541* (2013.01); *H01L 2225/06565* (2013.01); *H01L 2924/1431* (2013.01); *H01L 2924/1434* (2013.01); *H01L 2924/15311* (2013.01)

(58) Field of Classification Search
None
See application file for complete search history.

(56) References Cited

U.S. PATENT DOCUMENTS

| | | |
|---|---|---|
| 7,772,116 B2 | 8/2010 | Akram et al. |
| 8,884,416 B2 | 11/2014 | Lee et al. |

(Continued)

FOREIGN PATENT DOCUMENTS

KR        101022580        3/2011

*Primary Examiner* — Long Pham
(74) *Attorney, Agent, or Firm* — Onello & Mello, LLP

(57) ABSTRACT

A semiconductor device comprises a first semiconductor chip comprising a first substrate. A first magnetic tunnel junction is on the first substrate. A second semiconductor chip comprises a second substrate. A second magnetic tunnel junction is on the second substrate. The second semiconductor chip is positioned on the first semiconductor chip to form a chip stack. A first critical current density required for magnetization reversal of the first magnetic tunnel junction is different than a second critical current density required for magnetization reversal of the second magnetic tunnel junction.

20 Claims, 16 Drawing Sheets

(56) References Cited

U.S. PATENT DOCUMENTS 9,041,146 B2 5/2015 Lee et al.
9,183,890 B2 11/2015 Choi et al.
9,425,150 B2 8/2016 Huang et al.
9,472,595 B1 10/2016 Zhou et al.
9,484,530 B2 11/2016 Toh et al.

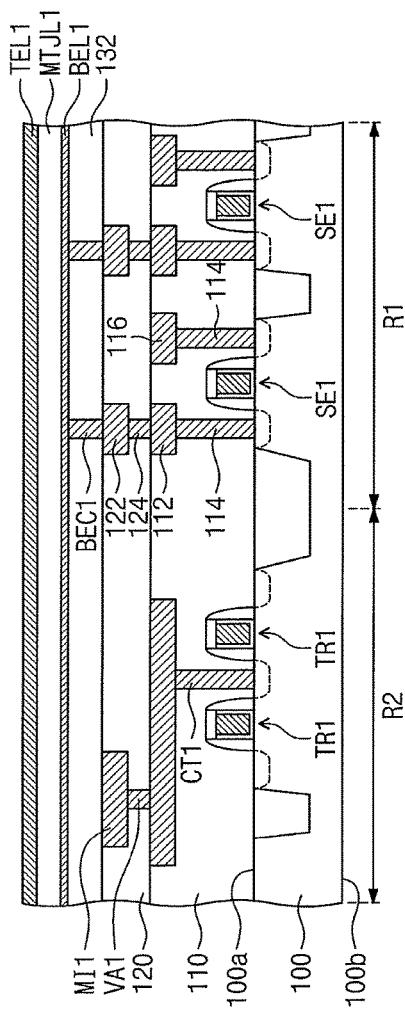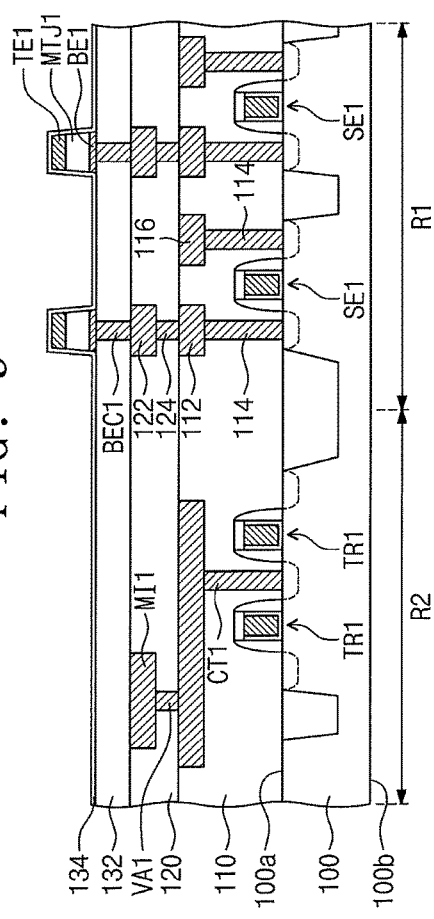

SEMICONDUCTOR DEVICE

CROSS-REFERENCE TO RELATED APPLICATIONS

This U.S. non-provisional patent application claims priority under 35 U.S.C § 119 of Korean Patent Application No. 10-2017-0038650 filed on Mar. 27, 2017, the entire content of which is hereby incorporated by reference.

BACKGROUND

The present inventive concepts relate to semiconductor devices, and, more particularly, to semiconductor devices including embedded magnetic memory elements.

In contemporary embedded semiconductor devices, memory elements and logic elements are commonly integrated together on a single chip. Such embedded semiconductor devices may include a primary memory element configured to store user data and a functional circuit configured to process specific functions requested by a user.

In modern electronic devices, memory devices of the non-volatile type are desired since they preserve user data, even in the absence of a power supply. Flash memory devices have become popular as non-volatile devices. However, flash memory devices are associated with relatively slow operating speeds, which may adversely impact the performance of the resulting system. Magnetic memory devices have been studied for potential to address and obviate the limitations of flash memory devices. Magnetic memory devices operate at relatively higher speeds and offer non-volatile characteristics; accordingly, magnetic memory devices have attracted considerable attention as next-generation memory devices. This is especially true as consumer electronics demand higher speeds, low power consumption, and ever-increasing integration.

SUMMARY

Embodiments of the present inventive concepts are directed to semiconductor devices including non-volatile memory cells having heightened retention characteristics. Embodiments are further directed to a random access memory cell having relatively high speed and relatively low power consumption.

According to exemplary embodiments of the present inventive concepts, a semiconductor device comprises a first semiconductor chip comprising a first substrate. A first magnetic tunnel junction is on the first substrate. A second semiconductor chip comprises a second substrate. A second magnetic tunnel junction is on the second substrate. The second semiconductor chip is positioned on the first semiconductor chip to form a chip stack. A first critical current density required for magnetization reversal of the first magnetic tunnel junction is different than a second critical current density required for magnetization reversal of the second magnetic tunnel junction.

According to exemplary embodiments of the present inventive concepts, a semiconductor device comprises: a first semiconductor chip and a second semiconductor chip stacked on a first semiconductor chip in a chip stack arrangement. The first semiconductor chip comprises: a first substrate including a first region and a second region; a first memory structure at the first region; and a first logic structure at the second region. The second semiconductor chip comprises: a second substrate including a third region and a fourth region; a second memory structure at the third region; and a second logic structure at the fourth region. The first memory structure comprises a first memory cell operable as a non-volatile memory (NVM) cell, and the second memory structure comprises a second memory cell operable as a random access memory (RAM) cell.

According to exemplary embodiments of the present inventive concepts, a semiconductor device comprises a first semiconductor chip comprising a first substrate extending in a horizontal direction and a first magnetic tunnel junction on the first substrate, and a second semiconductor chip comprising a second substrate extending in the horizontal direction and a second magnetic tunnel junction on the second substrate, the second semiconductor chip positioned on the first semiconductor chip to form a chip stack extending in a vertical direction relative to the horizontal direction. The first magnetic tunnel junction has a first critical current density required for magnetization reversal of the first magnetic tunnel junction. The second magnetic tunnel junction has a second critical current density required for magnetization reversal of the second magnetic tunnel junction. The first and second critical current densities required for magnetization reversal are different.

BRIEF DESCRIPTION OF THE DRAWINGS

FIGS. 8 to 11 are cross-sectional views for explaining a method of fabricating a chip stack according to exemplary embodiments of the present inventive concepts.

DETAILED DESCRIPTION OF EMBODIMENTS

Hereinafter, a semiconductor device according to exemplary embodiments of the present inventive concepts will be described in detail in conjunction with the accompanying drawings.

Figure 1:
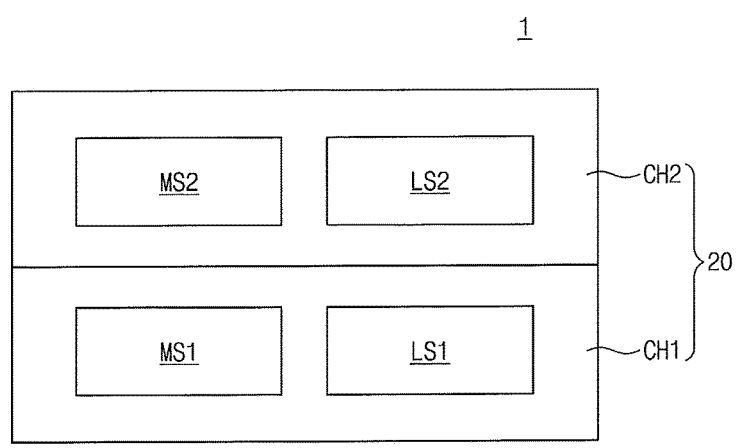
FIG. 1 is a simplified block diagram illustrating a semiconductor device according to exemplary embodiments of the present inventive concepts.

Referring to FIG. 1, a semiconductor device 1 may include a first semiconductor chip CH1 and a second semiconductor chip CH2 that constitute a chip stack 20. In some embodiments, the first and second semiconductor chips CH1 and CH2 may be vertically stacked, and thus combined with each other and electrically connected to each other. In some embodiments, the first and second semiconductor chips CH1 and CH2 may be connected with each other in a wafer-on-wafer, chip-on-wafer, or chip-on-chip bonding process. In some embodiments, the first and second semiconductor chips CH1 and CH2 may comprise different types of semiconductor chips. For example, in some embodiments, the first semiconductor chip CH1 may comprise a logic chip including embedded variable-resistance memory cells, and the second semiconductor chip CH2 may comprise a memory chip including variable resistance memory elements having non-volatile memory cell characteristics. Alternatively, in other embodiments, the first and second semiconductor chips CH1 and CH2 may comprise logic chips, which perform different functions with respect to each other and which each may include embedded variable-resistance memory cells. Chip stacks employing other combinations of different types of semiconductor chips are equally applicable to the present inventive concepts.

In some embodiments, referring in particular to the embodiment of FIG. 1, the first semiconductor chip CH1 may include a first memory structure MS1 and a first logic structure LS1 that are disposed on a first substrate, and the second semiconductor chip CH2 may include a second memory structure MS2 and a second logic structure LS2 that are disposed on a second substrate. Each of the memory structures MS1 and MS2 may include a memory cell array. For example, the memory cell array may include a plurality of two-dimensionally arranged memory cells or three-dimensionally arranged memory cells, a plurality of word lines electrically connected to the plurality of memory cells, a plurality of bit lines electrically connected to the plurality of memory cells, and a plurality of source lines electrically connected to the plurality of memory cells. Each of the memory cells may include a memory element and a select element. In some embodiments, the memory element may comprise a variable-resistance element that may be switched, or otherwise transitioned, between two resistance states in response to an applied electrical pulse. The select element may be configured to selectively control a flow of charge passing through the memory element. For example, the select element may comprise at least one of a PMOS or NMOS transistor.

Each of the logic structures LS1 and LS2 may include logic circuits for performing predetermined logic operations and/or peripheral circuits for driving the memory cells. The logic circuits may include logic cells for performing, for example, a Boolean logic function (e.g., INVERTER, AND, OR, NAND, NOR, etc.) or a data storage function (e.g., FLIP-FLOP). In various embodiments, the peripheral circuits may include a row decoder, a column select circuit, read/write circuit, and/or a control logic for driving (e.g., read, write, or erase operation) the memory cell. For example, in some embodiments, each of the logic structures LS1 and LS2 may include CMOS transistors, a resistor, a capacitor, and/or a routing structure that constitute the logic circuits and/or the peripheral circuits.

Figure 2A:
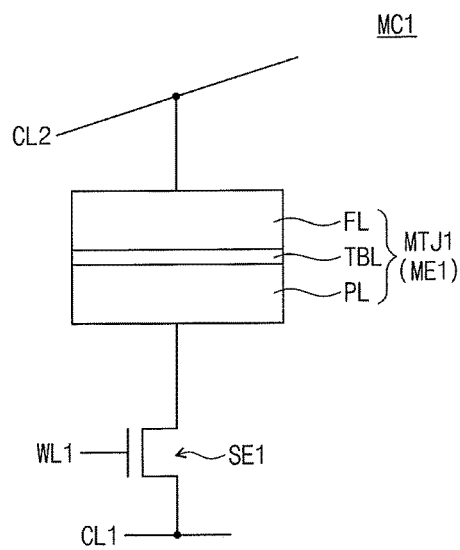
FIGS. 2A and 2B are schematic diagrams illustrating unit memory cells of the memory structures shown in FIG. 1.
Figure 2B:
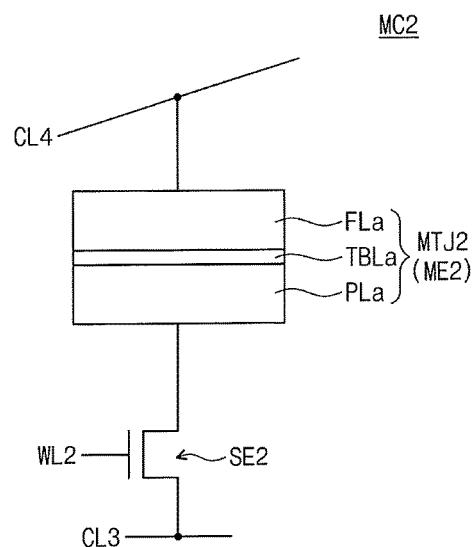

FIGS. 2A and 2B are schematic diagrams for explaining unit memory cells of memory structures shown in FIG. 1. Hereinafter, a unit memory cell of the first memory structure MS1 may be referred to as a first memory cell MC1, and a unit memory cell of the second memory structure MS2 may be referred to as a second memory cell MC2.

Referring to FIG. 2A, the first memory cell MC1 may include a first memory element ME1 and a first select transistor SE1. The first memory element ME1 may have a thin-film structure. In some embodiments, the electrical resistance of the element may be changed by application of an electrical current through the first memory element ME1 to thereby cause a change in the magnetization direction of the element. This is referred to as a spin-transfer phenomenon by those of knowledge in the art. The first memory element ME1 may have a thin-film structure configured to exhibit a magneto-resistance property, and may include at least one ferromagnetic material and/or at least one anti-ferromagnetic material. For example, the first memory element ME1 may comprise a magnetic memory element including a first magnetic tunnel junction MTJ1.

In some embodiments, the first magnetic tunnel junction MTJ1 may include a pinned layer PL, a free layer FL, and a tunnel barrier layer TBL interposed therebetween. The pinned layer PL may have a magnetization direction that is fixed in a first direction. The free layer FL may have a magnetization direction capable of orientation parallel or antiparallel to the magnetization direction of the pinned layer PL. The first magnetic tunnel junction MTJ1 may have an electrical resistance that is changed in response to the magnetization directions of the pinned layer PL and the free layer FL. For example, in some embodiment, when the pinned layer PL and the free layer FL have parallel magnetization directions, the first magnetic tunnel junction MTJ1 may have a low-resistance state and may thus be considered to be written with a data element of '0' corresponding to a first data. In contrast, when the pinned layer PL and the free layer FL have antiparallel magnetization directions, the first magnetic tunnel junction MTJ1 may have a high-resistance state and may thus be considered to be written with a data element of '1' corresponding to a second data.

The first select transistor SE1 may have a gate electrode connected to a first word line WL1 corresponding thereto, a first terminal electrically connected to a first conductive line CL1, and a second terminal electrically connected in series through the first magnetic tunnel junction MTJ1 to a second conductive line CL2. For example, in some embodiments, the first conductive line CL1 may correspond to a source line electrically connected to a source of the first select transistor SE1, and the second conductive line CL2 may correspond to a bit line electrically connected to a drain of the first select transistor SE1. Alternatively, in other embodiments, the first conductive line CL1 may correspond to the bit line, and the second conductive line CL2 may correspond to the source line. A write voltage applied through the bit line can write data to the first memory element ME1, and a read voltage applied through the bit line may read data stored in the first memory element ME1.

FIG. 2A shows that the free layer FL is connected to the second conductive line CL2 and the pinned layer PL is connected to the first select transistor SE1, however, embodiments of the present inventive concepts are not limited thereto. For example, in other embodiments, the pinned layer PL may be connected to the second conductive line CL2 and the free layer FL may be connected to the first select transistor SE1.

Figure 3A:
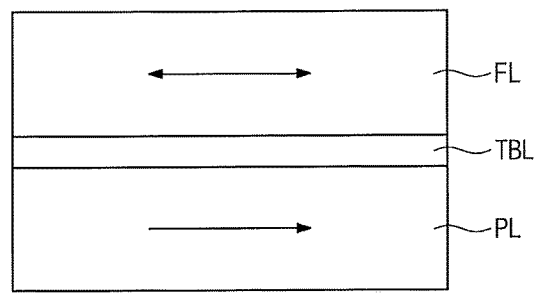
FIGS. 3A and 3B are conceptual diagrams illustrating a first magnetic tunnel junction according to exemplary embodiments of the present inventive concepts.
Figure 3B:
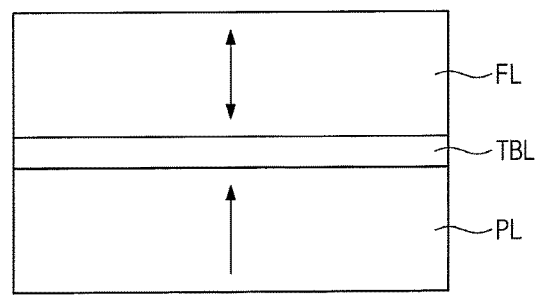

FIGS. 3A and 3B are conceptual diagrams for explaining a first magnetic tunnel junction according to exemplary embodiments of the present inventive concepts. The first magnetic tunnel junction MTJ1 may have an electrical resistance property that is dependent on the magnetization directions of the neighboring pinned layer PL and the free layer FL. For example, the electrical resistance of the first magnetic tunnel junction MTJ1 may be much greater when the pinned and free layers PL and FL have antiparallel magnetization directions. Accordingly, the electrical resistance of the first magnetic tunnel junction MTJ1 may be much less when the pinned and free layers PL and FL have parallel magnetization directions. Consequently, the electrical resistance of the first magnetic tunnel junction MTJ1 may be adjusted by imparting a change in the magnetization direction of the free layer FL. This physical phenomenon may be employed in connection with the storage and retrieval of data in a magnetic memory device according to exemplary embodiments of the present inventive concepts.

Referring to FIG. 3A, the pinned layer PL and the free layer FL may comprise magnetic layers configured to create an in-plane magnetization structure in which the pinned layer PL and the free layer FL have magnetization directions that are substantially parallel to a top surface, or primary surface, of the tunnel barrier layer TBL. In this case, the pinned layer PL may include a layer having an anti-ferromagnetic material and a layer having a ferromagnetic material. In some embodiments, the layer having an anti-ferromagnetic material may include one or more of PtMn, IrMn, MnO, MnS, MnTe, $MnF_2$, $FeCl_2$, FeO, $CoCl_2$, CoO, $NiCl_2$, NiO, and Cr, or combinations thereof. In other embodiments, the layer having an anti-ferromagnetic material may include at least one selected from precious metals. The precious metals may include ruthenium (Ru), rhodium (Rh), palladium (Pd), osmium (Os), iridium (Ir), platinum (Pt), gold (Au), or silver (Ag), or combinations thereof. The layer having a ferromagnetic material may include one or more of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$, or combinations thereof.

The free layer FL may include a material having a changeable magnetization direction. The free layer FL may include a ferromagnetic material. For example, the free layer FL may include one or more of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$, or combinations thereof.

The free layer FL may itself include a plurality of layers. For example, the free layer FL may include layers having a plurality of ferromagnetic materials and a layer having a non-magnetic material positioned between the layers. In this case, the layers having a plurality of ferromagnetic materials and the layer having a non-magnetic material may constitute a synthetic anti-ferromagnetic layer. The synthetic anti-ferromagnetic layer may help to reduce critical current density and enhance thermal stability of the resulting magnetic memory device.

The tunnel barrier layer TBL may include one or more of oxide of magnesium (Mg), oxide of titanium (Ti), oxide of aluminum (Al), oxide of magnesium-zinc (MgZn), oxide of magnesium-boron (MgB), nitride of titanium (Ti), and nitride of vanadium (V), or combinations thereof. For example, the tunnel barrier layer TBL may be a single or monolayer of magnesium oxide (MgO). Alternatively, the tunnel barrier layer TBL may include a plurality of layers. In some embodiments, a chemical vapor deposition (CVD) process may be used to form the tunnel barrier layer TBL.

Referring to FIG. 3B, the pinned layer PL and the free layer FL may have a perpendicular magnetization structure in which the pinned layer PL and the free layer FL have magnetization directions substantially perpendicular, or normal, to the top, or primary, surface of the tunnel barrier layer TBL. In this case, each of the pinned layer PL and the free layer FL may include one or more of a material having an $L_{10}$ crystal structure and an amorphous RE-TM (Rare-Earth Transition Metal) alloy. For example, each of the pinned layer PL and the free layer FL may include at least one material having an $L_{10}$ crystal structure, such as $Fe_{50}Pt_{50}$, $Fe_{50}Pd_{50}$, $Co_{50}Pt_{50}$, $Co_{50}Pd_{50}$, $Fe_{50}Ni_{50}$, etc., or combinations thereof. Alternatively, each of the pinned layer PL and the free layer FL may include a $Co_3Pt$ ordered alloy or a cobalt-platinum (CoPt) disordered alloy that have a platinum (Pt) content ranging from about 10 to 45 at % and a hexagonal close-packed lattice. Alternatively, each of the pinned layer PL and the free layer FL may include at least one of amorphous RE-TM alloys that contain at least one selected from iron (Fe), cobalt (Co), and nickel (Ni) and at least one of rare earth metals such as terbium (Tb), dysprosium (Dy), and gadolinium (Gd).

The pinned layer PL and the free layer FL may include a material having an interface perpendicular magnetic anisotropy. The interface perpendicular magnetic anisotropy may refer to a phenomenon where a magnetic layer having an intrinsic in-plane magnetization property has a perpendicular magnetization direction due to an effect from an interface with another layer adjacent to the magnetic layer. Herein, the term "intrinsic in-plane magnetization property" may mean that a magnetic layer has a magnetization direction parallel to its widest surface (or its longitudinal direction) when there is no external influence. For example, when a substrate is provided thereon with a magnetic layer having the intrinsic in-plane magnetization property and no external magnetic influence is applied, the magnetic layer may have a magnetization direction substantially parallel to the top surface of the tunnel barrier layer TBL.

Each of the pinned layer PL and the free layer FL may include, for example, one or more of cobalt (Co), iron (Fe), and nickel (Ni), or combinations thereof. In addition, each of the pinned layer PL and the free layer FL may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N), or combinations thereof. For example, each of the pinned layer PL and the free layer FL may include CoFe or NiFe and may further include boron (B). Moreover, in order to reduce saturation magnetization, each of the pinned layer PL and the free layer FL may further include one or more of titanium (Ti), aluminum (Al), magnesium (Mg), tantalum (Ta), and silicon (Si), or combinations thereof.

Returning to FIG. 2B, a second memory cell MC2 may have a structure identical to or similar to that of the first memory cell MC1. The second memory cell MC2 may include a second magnetic tunnel junction MTJ2 as a memory element and a second select transistor SE2 as a select element. The second select transistor SE2 may have a gate electrode connected to a second word line WL2 corresponding thereto, a first terminal electrically connected to a third conductive line CL3, and a second terminal electrically connected in series through the second magnetic tunnel junction MTJ2 to a fourth conductive line CL4. In some embodiments, one of the third and fourth conductive lines CL3 and CL4 may correspond to a source line, and the other of the third and fourth conductive lines CL3 and CL4 may correspond to a bit line. The second magnetic tunnel junction MTJ2 may include a pinned layer PLa, a free layer FLa, and a tunnel barrier layer TBLa interposed therebetween. The pinned layer PLa, the free layer FLa, and the tunnel barrier layer TBLa of the second magnetic tunnel junction MTJ2 may include materials identical or similar to those of the pinned layer PL, the free layer FL, and the tunnel barrier layer TBL, respectively, of the first magnetic tunnel junction MTJ1. For example, in some embodiments, the second magnetic tunnel junction MTJ2 may be configured to be a variable-resistance element that may be switched from one to the other of its two resistance states by an applied electrical pulse.

According to the present inventive concepts, in some embodiments, one of the first and second memory cells MC1 and MC2 may operate as a non-volatile memory (NVM) cell, and the other of the first and second memory cells MC1 and MC2 may operate as a random access memory (RAM) cell. For example, in a first configuration, the first memory cell MC1 may operate as an NVM cell that maintains its state when power is removed from the system, and the second memory cell MC2 may operate as a RAM cell that loses its state when power is removed from the system.

In detail, a required applied critical current, required applied critical voltage, or crucial applied duration of the critical current or voltage may be greater when the first magnetic tunnel junction MTJ1 is switched from a low resistance state to a high resistance state (or from a high resistance state to a low resistance state) than when the second magnetic tunnel junction MTJ2 is switched from a low resistance state to a high resistance state (or from a high resistance state to a low resistance state). That is, a critical current density required for magnetization reversal may be greater for the first magnetic tunnel junction MTJ1 than for the second magnetic tunnel junction MTJ2. Accordingly, the second magnetic tunnel junction MTJ2 may have relatively easier switching characteristics in comparison with the first magnetic tunnel junction MTJ1, and the first magnetic tunnel junction MTJ1 may have retention characteristics superior to those of the second magnetic tunnel junction MTJ2. Hereinafter, there will be described an example where the first memory cell MC1 operates as an NVM (non-volatile memory) cell and the second memory cell MC2 operates as a RAM (random access memory) cell.

Figure 4A:
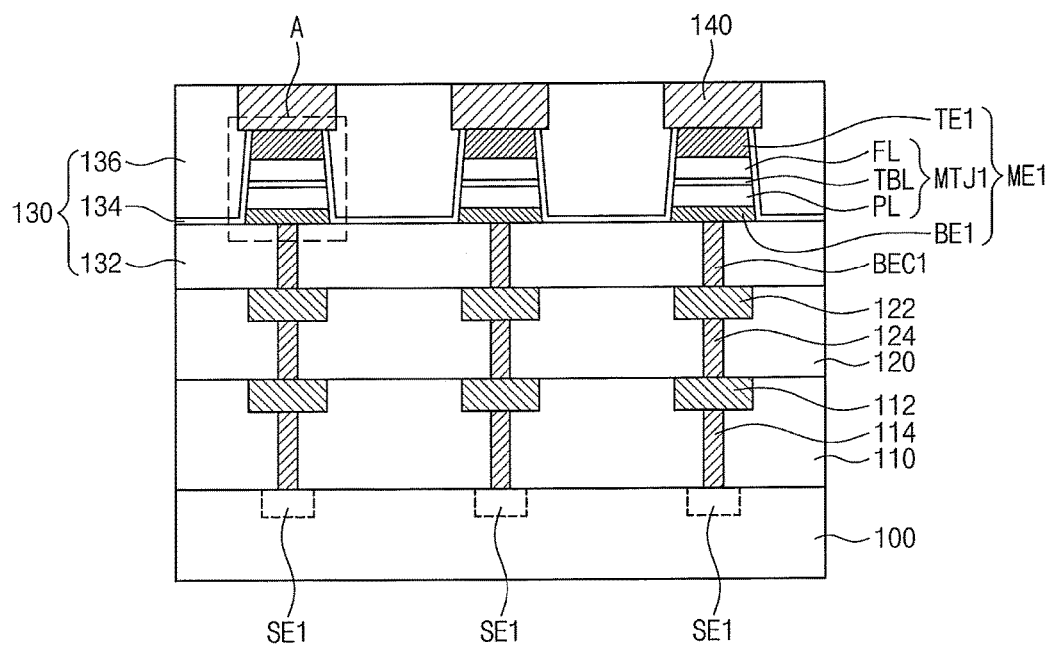
FIG. 4A is a cross-sectional view partially showing a first memory structure shown in FIG. 1 according to exemplary embodiments of the present inventive concepts.
Figure 4B:
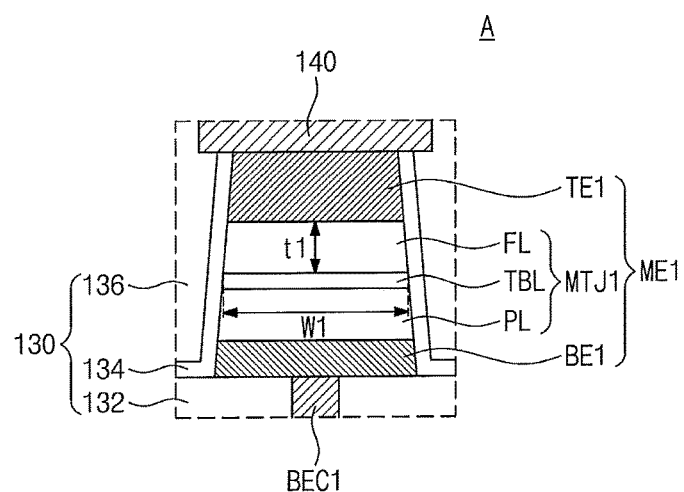
FIGS. 4B and 4C are enlarged views corresponding to section A of FIG. 4A.
Figure 4C:
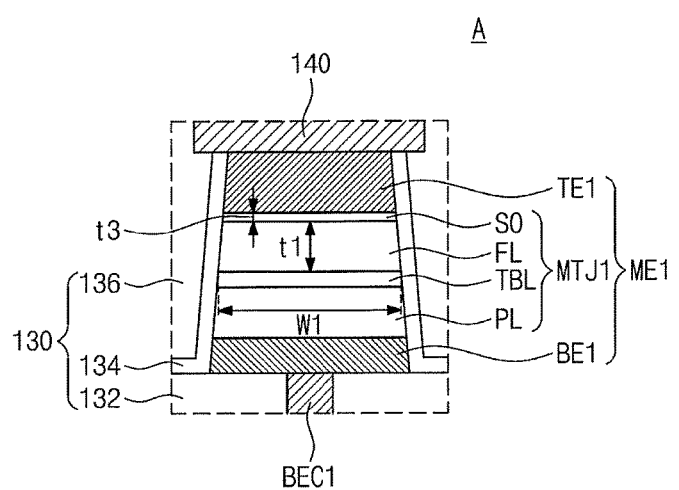
Figure 5A:
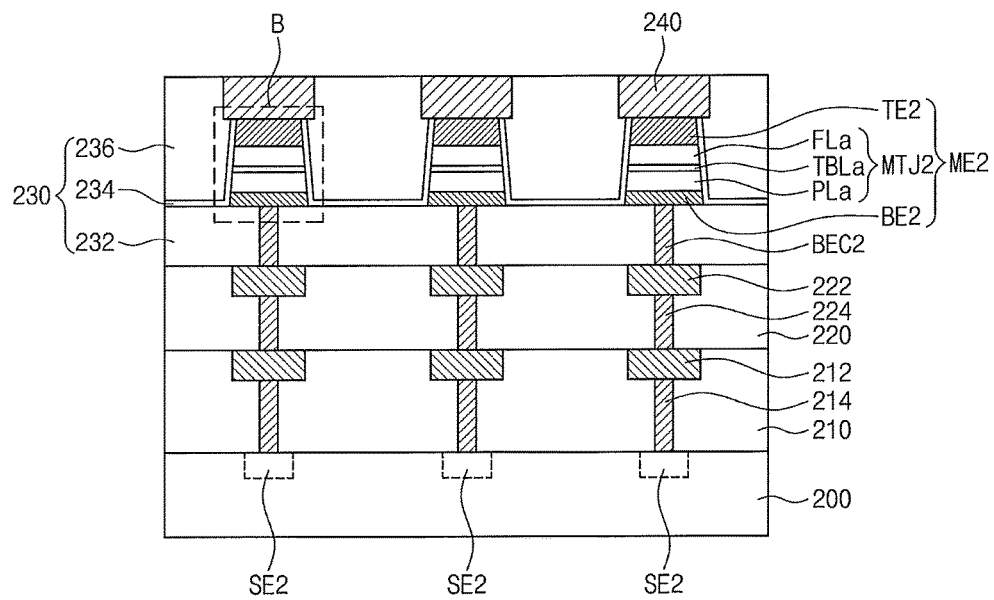
FIG. 5A is a cross-sectional view partially showing a second memory structure shown in FIG. 1 according to exemplary embodiments of the present inventive concepts.
Figure 5B:
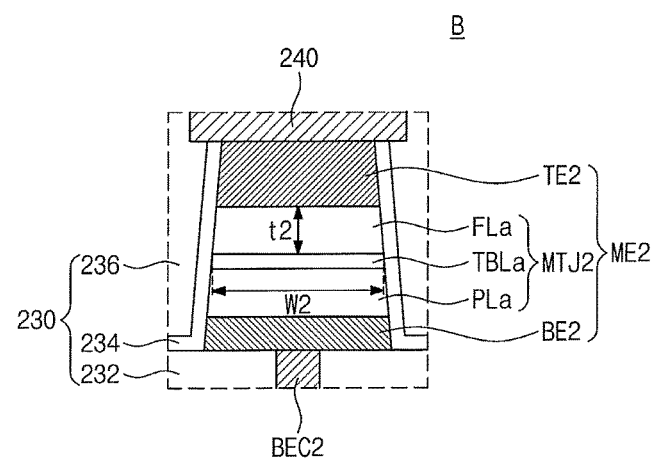
FIGS. 5B and 5C are enlarged views corresponding to section B of FIG. 5A.
Figure 5C:
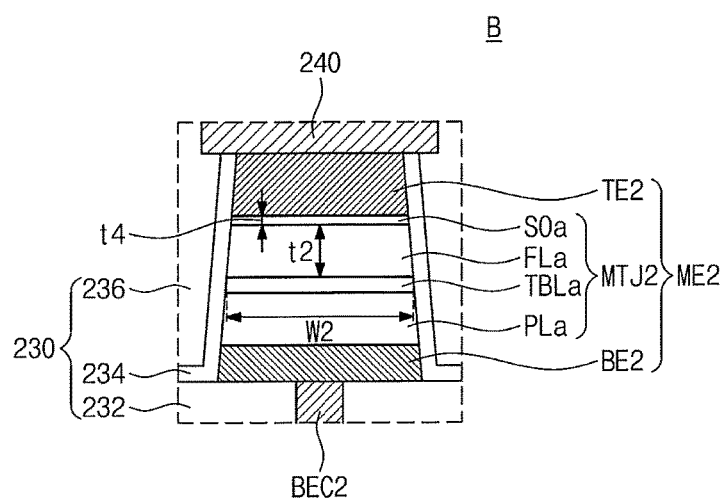

FIG. 4A is a cross-sectional view partially illustrating a first memory structure of FIG. 1. FIGS. 4B and 4C are enlarged views corresponding to section A of FIG. 4A. FIG. 5A is a cross-sectional view partially illustrating a second memory structure of FIG. 1. FIGS. 5B and 5C are enlarged views corresponding to section B of FIG. 5A.

Referring to FIG. 4A, a first substrate 100 may comprise a semiconductor substrate such as, for example, a silicon substrate, a germanium substrate, or a silicon-germanium substrate, or other suitable substrate material. The first substrate 100 may be provided therein with first select transistors SE1 corresponding to the select elements of the first memory cells (see MC1 of FIG. 2A).

The first substrate 100 may be provided thereon with a first interlayer dielectric layer 110 covering or otherwise on the first select transistors SE1. First conductive patterns 112 and first cell contacts 114 may be provided in the first interlayer dielectric layer 110. Each of the first conductive patterns 112 may be electrically connected through its underlying first cell contact 114 to the first select transistor SE1. In some embodiments, the first conductive patterns 112 may have island shapes in the horizontal direction that are two-dimensionally arranged. The first conductive patterns 112 may have top surfaces at substantially the same height as that of a top surface of the first interlayer dielectric layer 110.

A second interlayer dielectric layer 120 may be disposed on the first interlayer dielectric layer 110. Second conductive patterns 122 and first cell vias 124 may be provided in the second interlayer dielectric layer 120. Each of the first cell vias 124 may connect the first and second conductive patterns 112 and 122 vertically spaced apart from each other. The second conductive patterns 122 may have top surfaces at substantially the same height as that of a top surface of the second interlayer dielectric layer 120. Each of the first and second interlayer dielectric layers 110 and 120 may comprise a single layer or multiple layers, and may include silicon oxide, silicon nitride, and/or silicon oxynitride, combinations thereof, or other suitable dielectric material. The first and second conductive patterns 112 and 122, and the first cell contacts 114, and the first cell vias 124 may include metal (e.g., tungsten or copper) or conductive metal nitride (e.g., titanium nitride, tantalum nitride, or tungsten nitride) or other suitable conductive material. Although not shown, an etch stop layer may be interposed between the first and second interlayer dielectric layers 110 and 120. The etch stop layer may include, for example, silicon nitride or silicon carbonitride, or other suitable etch stop material. In addition, first lower conductive lines (not shown) may be disposed either in the first interlayer dielectric layer 110 or in the second interlayer dielectric layer 120. The first lower conductive lines (not shown) may include the same material as that of the first conductive pattern 112 or the second conductive pattern 122. The first lower conductive line (not shown) may correspond to the first conductive line CL1 discussed with reference to FIG. 2A.

A third interlayer dielectric layer 130 may be disposed on the second interlayer dielectric layer 120. The third interlayer dielectric layer 130 may have first bottom electrode contacts BEC1, first memory elements ME1, and first upper conductive lines 140. In some embodiments, the third interlayer dielectric layer 130 may include a first mold insulation layer 132, a first protective insulation layer 134, and a second mold insulation layer 136 sequentially stacked on the second interlayer dielectric layer 120.

The first bottom electrode contacts BEC1 may be disposed in the first mold insulation layer 132. In some embodiments, the first bottom electrode contacts BEC1 may each be coupled to a corresponding one of the second conductive patterns 122. Each of the first bottom electrode contacts BEC1 may include one or more of metal (e.g., tungsten, aluminum, titanium, or tantalum), conductive metal nitride (e.g., titanium nitride, tantalum nitride, or tungsten nitride), and metal-semiconductor compound (e.g., metal silicide) or other suitable electrode contact material.

The first mold insulation layer 132 may be provided thereon with the first memory elements ME1 coupled to the first bottom electrode contacts BEC1. In some embodiments, each of the first memory elements ME1 may include a first bottom electrode BE1, a first magnetic tunnel junction MTJ1, and a first top electrode TE1. In some embodiments, the first bottom electrode BE1 may be disposed between the first bottom electrode contact BEC1 and the first magnetic tunnel junction MTJ1, and the first top electrode TE1 may be disposed between the first magnetic tunnel junction MTJ1 and the first upper conductive line 140. The first bottom electrode BE1 may include one or more of conductive metal nitride (e.g., titanium nitride, tantalum nitride, etc.) and rare earth metal (e.g., ruthenium, platinum, etc.), or other suitable electrode material. The first top electrode TE1 may include one or more of metal (e.g., tungsten, titanium, tantalum, or aluminum) and conductive metal nitride (e.g., titanium nitride or tantalum nitride) or other suitable electrode material. The first magnetic tunnel junction MTJ1 may include a pinned layer PL, a free layer FL, and a tunnel barrier layer TBL interposed therebetween. Constituent materials of the pinned layer PL, the free layer FL, and the tunnel barrier layer TBL are discussed herein with reference to FIGS. 2A, 3A, and 3B, and detailed descriptions thereof will be omitted. Each of the first memory elements ME1 may be electrically connected through its underlying first bottom electrode contact BEC1 to the second conductive pattern 122. The first mold insulation layer 132 may have a top surface that is recessed in a direction toward the first substrate 100, at portions where the first mold insulation layer 132 does not overlap the first memory elements ME1.

The first upper conductive lines 140 may be disposed on top surfaces of the first memory elements ME1. In some embodiments, the first upper conductive lines 140 may be directly coupled to a underlying one of the first memory elements ME1. Embodiments of the present inventive concepts, however, are not limited thereto. The first upper conductive lines 140 may include metal (e.g., tungsten or copper) or conductive metal nitride (e.g., titanium nitride, tantalum nitride, or tungsten nitride), or other suitable conductive material. The first upper conductive line 140 may correspond to the second conductive line CL2 discussed with reference to FIG. 2A. For example, in some embodiments, the first lower conductive line (not shown) may operate as a source line, and the first upper conductive line 140 may operate as a bit line.

The first mold insulation layer 132 may be provided thereon with the second mold insulation layer 136 covering sidewalls of the first memory elements ME1 and sidewalls of the first upper conductive lines 140. The first conductive lines 140 may have top surfaces at substantially the same height as that of a top surface of the second mold insulation layer 136. That is, the top surface of the second mold insulation layer 136 may be coplanar with the top surfaces of the first upper conductive lines 140. In some embodiments, the first protective insulation layer 134 may be positioned between the second mold insulation layer 136 and the sidewalls of the first memory elements ME1 and between the first and second mold insulation layers 132 and 136. The first and second mold insulation layers 132 and 136 may include, for example, silicon oxide, and the first protective insulation layer 134 may include, for example, silicon nitride. Although not shown, an etch stop layer (not shown) may be interposed between the second and third interlayer dielectric layers 120 and 130.

The second memory structure (see MS2 of FIG. 1) may have a structure similar to that of the first memory structure (see MS1 of FIG. 1). Referring to FIG. 5A, the second memory structure MS2 may include interlayer dielectric layers 210, 220, and 230 sequentially stacked on a second substrate 200, and may also include third conductive patterns 212, fourth conductive patterns 222, second cell contacts 214, second cell vias 224, second memory elements ME2, and second upper conductive lines 240 provided in the interlayer dielectric layers 210, 220, and 230. The second substrate 200 may be the same semiconductor substrate as the first substrate 100, and may be provided therein with second select transistors SE2 corresponding to the select elements of the second memory cells (see MC2 of FIG. 2B).

The interlayer dielectric layers 210, 220, and 230 may include a fourth interlayer dielectric layer 210, a fifth interlayer dielectric layer 220, and a sixth interlayer dielectric layer 230 sequentially stacked on the second substrate 200. The third conductive patterns 212 may be disposed in the fourth interlayer dielectric layer 210, and the fourth conductive patterns 222 may be disposed in the fifth interlayer dielectric layer 220. The third conductive patterns 212 may have top surfaces at substantially the same height as that of a top surface of the fourth interlayer dielectric layer 210, and the fourth conductive patterns 222 may have top surfaces at substantially the same height as that of a top surface of the fifth interlayer dielectric layer 220. The second cell contacts 214 may be disposed in the fourth interlayer dielectric layer 210, and may each electrically connect the third conductive pattern 212 to its corresponding second select transistor SE2. The second cell vias 224 may be disposed in the fifth interlayer dielectric layer 220, and may each connect a pair of the third and fourth conductive patterns 212 and 222 vertically spaced apart from each other. Each of the fourth and fifth interlayer dielectric layers 210 and 220 may be composed of a single layer or multiple layers, and may include silicon oxide, silicon nitride, and/or silicon oxynitride. The third and fourth conductive patterns 212 and 222 may include the same material as those of the first and second conductive patterns 112 and 122 of the first memory structure MS1, and the second cell contacts and vias 214 and 224 may include the same material as those of the first cell contacts and vias 114 and 124 of the first memory structure MS1. For example, the third conductive patterns 212, the fourth conductive patterns 222, the second cell contacts 214, and the second cell vias 224 may each include metal (e.g., tungsten or copper) or conductive metal nitride (e.g., titanium nitride, tantalum nitride, or tungsten nitride). Although not shown, an etch stop layer may be interposed between the fourth and fifth interlayer dielectric layers 210 and 220. The etch stop layer may include, for example, silicon nitride or silicon carbonitride. In addition, second lower conductive lines (not shown) may be disposed either in the fourth interlayer dielectric layer 210 or in the fifth interlayer dielectric layer 220. The second lower conductive lines (not shown) may include a material the same as that of the third conductive pattern 212 or the fourth conductive pattern 222. The second lower conductive line (not shown) may correspond to the third conductive line CL3 discussed with reference to FIG. 2B.

The second memory elements ME2 and the second upper conductive lines 240 may be positioned in the sixth interlayer dielectric layer 230. The second memory elements ME2 may be arranged to have island shapes. In some embodiments, each of the second memory elements ME2 may include a second bottom electrode BE2, a second magnetic tunnel junction MTJ2, and a second top electrode TE2. The second bottom electrode BE2 and the second top electrode TE2 may respectively include the same material as those of the first bottom electrode BE1 and the first top electrode TE1 of the first magnetic tunnel junction MTJ1. The second magnetic tunnel junction MTJ2 may include a pinned layer PLa, a free layer FLa, and a tunnel barrier layer TBLa interposed therebetween. The pinned layer PLa, the tunnel barrier layer TBLa, and the free layer FLa of the second magnetic tunnel junction MTJ2 may respectively include materials identical or similar to those of the pinned layer PL, the tunnel barrier layer TBL, and the free layer FL of the first magnetic tunnel junction MTJ1.

The second upper conductive lines 240 may be disposed on top surfaces of the second memory elements ME2, and may each be directly coupled to its underlying one of the second memory elements ME2. The second upper conductive line 240 may correspond to the fourth conductive line CL4 discussed with reference to FIG. 2B. For example, the second lower conductive line (not shown) may operate as a source line, and the second upper conductive line 240 may operate as a bit line.

The sixth interlayer dielectric layer 230 may include a third mold insulation layer 232, a second protective insulation layer 234, and a fourth mold insulation layer 236 that are sequentially stacked. The second bottom electrode contact BEC2 may penetrate the third mold insulation layer 232, and then connect the second memory element ME2 to the fourth conductive pattern 222. The second bottom electrode contact BEC2 may include a material the same as that of the first bottom electrode contact BEC1. In contrast with the embodiment shown in FIG. 5A, the third mold insulation layer 232 may have a top surface that is recessed toward the second substrate 200, on portions where the third mold insulation layer 232 does not overlap the second memory elements ME2. The third mold insulation layer 232 may be provided thereon with the fourth mold insulation layer 236 covering sidewalls of the second memory elements ME2 and sidewalls of the second upper conductive lines 240. The second conductive lines 240 may have top surfaces at substantially the same height as that of a top surface of the fourth mold insulation layer 236. The second protective insulation layer 234 may be positioned between the fourth mold insulation layer 236 and the sidewalls of the second memory elements ME2 and between the third and fourth mold insulation layers 232 and 236. The third and fourth mold insulation layers 232 and 236 may include, for example, silicon oxide, and the second protective insulation layer 234 may include, for example, silicon nitride. Although not shown, an etch stop layer (not shown) may be positioned between the fifth and sixth interlayer dielectric layers 220 and 230.

As discussed herein, in some embodiments, the first memory cell MC1 may be configured to operate as an NVM cell, and the second memory cell MC2 may be configured to operate as a RAM cell. The first magnetic tunnel junction MTJ1 may be characterized by a high-retention property to cause the first memory cell MC1 to operate as an NVM cell, and the second magnetic tunnel junction MTJ2 may be characterized by a low switching current to cause the second memory cell MC2 to operate as a RAM cell. A magnetic tunnel junction may generally have a trade-off relationship between its switching and retention characteristics. In order to achieve the conflicting characteristics, one of the first and second magnetic tunnel junctions MTJ1 and MTJ2 may be configured to include thin-layers whose structures and/or materials are different from those of thin-layers included in the other of the first and second magnetic tunnel junctions MTJ1 and MTJ2. For example, the first magnetic tunnel junction MTJ1 may be configured to have a relatively greater critical current density necessary for magnetization reversal, and the second magnetic tunnel junction MTJ2 may be configured to have a relatively smaller critical current density necessary for magnetization reversal. As an approach to accomplish the different features mentioned above, the free layers FL and FLa of the first memory element ME1 and second memory element ME2 respectively may be controlled to have different characteristics. For example, they may be controlled to have different respective volumes, or different respective materials, each of which may impact the critical current density necessary for magnetization reversal in the resulting memory element. This feature will be described in detail herein with reference to FIGS. 4B, 4C, 5B, and 5C.

In some embodiments, the free layer FL of the first magnetic tunnel junction MTJ1 may have a volume greater than that of the free layer FLa of the second magnetic tunnel junction MTJ2. For example, as shown in FIGS. 4B and 5B, the first magnetic tunnel junction MTJ1 may have a first width W1 (or a first diameter) greater than a second width W2 (or a second diameter) of the second magnetic tunnel junction MTJ2. In this description, the first width W1 of the first magnetic tunnel junction MTJ1 may be defined as a minimum width, in a horizontal direction, of the tunnel barrier layer TBL (in other words, a maximum width of the free layer FL) interposed between the two magnetic layers PL and FL, and the second width W2 of the second magnetic tunnel junction MTJ2 may be defined as a minimum width, in a horizontal direction, of the tunnel barrier layer TBLa (in other words, a maximum width of the free layer FLa) interposed between the two magnetic layers PLa and FLa. In this case, the free layers FL and FLa of the first magnetic tunnel junction MTJ1 and second magnetic tunnel junction MTJ2 respectively may have the same thickness, i.e., t1=t2, and/or may include the same material. Alternatively, the free layer FL of the first magnetic tunnel junction MTJ1 may have a first thickness t1 greater than a second thickness t2 of the free layer FLa of the second magnetic tunnel junction MTJ2. In this case, the magnetic tunnel junctions MTJ1 and MTJ2 may have the same width, i.e., W1=W2, and/or the free layers FL and FLa may include the same material.

In other embodiments, the free layer FL of the first magnetic tunnel junction MTJ1 may include a material, a saturation magnetization of which, is greater than that of the free layer FLa of the second magnetic tunnel junction MTJ2. For example, when each of the free layers FL and FLa includes cobalt (Co), iron (Fe), and boron (B), content (e.g., atomic concentration) of boron may be greater in the free layer FL than in the free layer FLa. In a case that the free layer FL includes $Co_aFe_bB_c$ and the free layer FLa includes $Co_xFe_yB_z$, c may be greater than z (i.e., c>z). In this case, a and b may be, but not limited to, equal to x and y, respectively (i.e., a=x, b=y). Alternatively, the free layer FL may be composed of a double layer of CoFeB and NiCoFeB, while the free layer FLa may be composed of a single layer of CoFeB. When the free layer FL includes a material whose saturation magnetization is greater than that of the free layer FLa, the magnetic tunnel junctions MTJ1 and MTJ2 may have the same width (i.e., W1=W2) and/or the free layers FL and FLa may have the same thickness (i.e., t1=t2); however, embodiments of the present inventive concepts are not limited thereto.

In still other embodiments, as shown in FIGS. 4C and 5C, the first magnetic tunnel junction MTJ1 may further include a sub-oxide layer SO between the free layer FL and the first top electrode TE1, and the second magnetic tunnel junction MTJ2 may further include a sub-oxide layer SOa between the free layer FLa and the second top electrode TE2. In some embodiments, the sub-oxide layers SO and SOa may include the same metal oxide material. For example, the sub-oxide layers SO and SOa may include one or more of tantalum oxide, titanium oxide, tungsten oxide, hafnium oxide, zirconium oxide, scandium oxide, niobium oxide, and vanadium oxide, or combinations thereof. In the present embodiment, the sub-oxide layer SO of the first magnetic tunnel junction MTJ1 may have a third thickness t3 greater than a fourth thickness t4 of the sub-oxide layer SOa of the second magnetic tunnel junction MTJ2. An interface perpendicular magnetic anisotropy of the free layer may increase with increasing thickness of the sub-oxide layer, thereby improving retention characteristics of the magnetic tunnel junction.

According to embodiments of the present inventive concepts, memory cells of semiconductor chips constituting a chip stack may each include magnetic tunnel junctions with different switching characteristics. Accordingly, a semiconductor device may be provided having both non-volatile memory cells of enhanced retention characteristics and random access memory cells having enhanced high-speed and low-power consumption characteristics.

Figure 6:
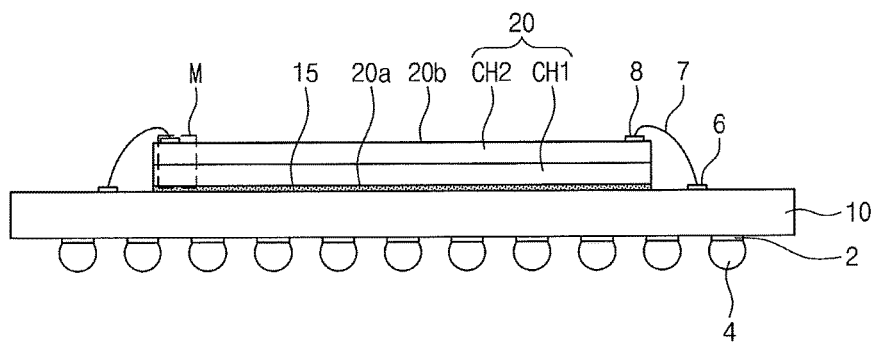
FIG. 6 is a cross-sectional view illustrating a semiconductor package according to exemplary embodiments of the present inventive concepts.

Referring to FIG. 6, a chip stack 20 may be mounted on a package substrate 10. For example, the package substrate 10 may be a printed circuit board (PCB). The package substrate 10 may include circuit patterns (not shown). One or more of the circuit patterns may be electrically connected to first outer connecting pads 2 on a bottom surface of the package substrate 10. The first outer connecting pads 2 may be adhered with corresponding outer connecting terminals 4, such as solder bumps or solder balls, through which the package substrate 10 is electrically connected to an external device. One or more of the circuit patterns may be electrically connected to second outer connecting pads 6 on a top surface of the package substrate 10.

The chip stack 20 may have a first surface 20a facing the package substrate 10 and a second surface 20b opposite to the first surface 20a. The chip stack 20 may include a first semiconductor chip CH1 and a second semiconductor chip CH2 that are vertically stacked. The chip stack 20 may be constituted by the first and second semiconductor chips CH1 and CH2 that are physically and electrically connected to each other in a wafer-on-wafer manner. For example, first and second wafers may be bonded together at the wafer level and then diced into chips to for the chip stacks 20. In some embodiments, the first semiconductor chip CH1 may include the first memory structure MS1 and the first logic structure LS1 as described herein in connection with the embodiment of FIG. 1, and the second semiconductor chip CH2 may include the second memory structure MS2 and the second logic structure LS2 as described herein in connection with the embodiment of FIG. 1.

The chip stack 20 may be adhered through an adhesion layer 15 to the package substrate 10. The adhesion layer 15 may be interposed between the first surface 20a of the chip stack 20 and the top surface of the package substrate 10. In some embodiments, the adhesion layer 15 may comprise an epoxy, a silicon-based insulation layer, a tape, or combinations thereof. Bonding pads 8 may be disposed on the second surface 20b of the chip stack 20. The bonding pads 8 may be electrically connected to integrated circuits of the first and second semiconductor chips CH1 and CH2. Wires 7 may electrically connect the bonding pads 8 of the chip stack 20 to corresponding second outer connecting pads 6 of the package substrate 10. In some embodiments, the chip stack 20 may communicate with an external controller or other electronic systems (not shown) by the wires 7. The chip stack 20 may be provided through the wires 7 with record data, voltage signals, control signals including an address signal, a command signal, and the like from the controller.

The package substrate 10 may be provided thereon with a molding layer (not shown) covering the chip stack 20 and the wires 7. The molding layer (not shown) may protect the chip stack 20 and the wires 7 from interference with the external environment. In some embodiments, the molding layer (not shown) may include an epoxy molding compound (EMC).

Figure 7:
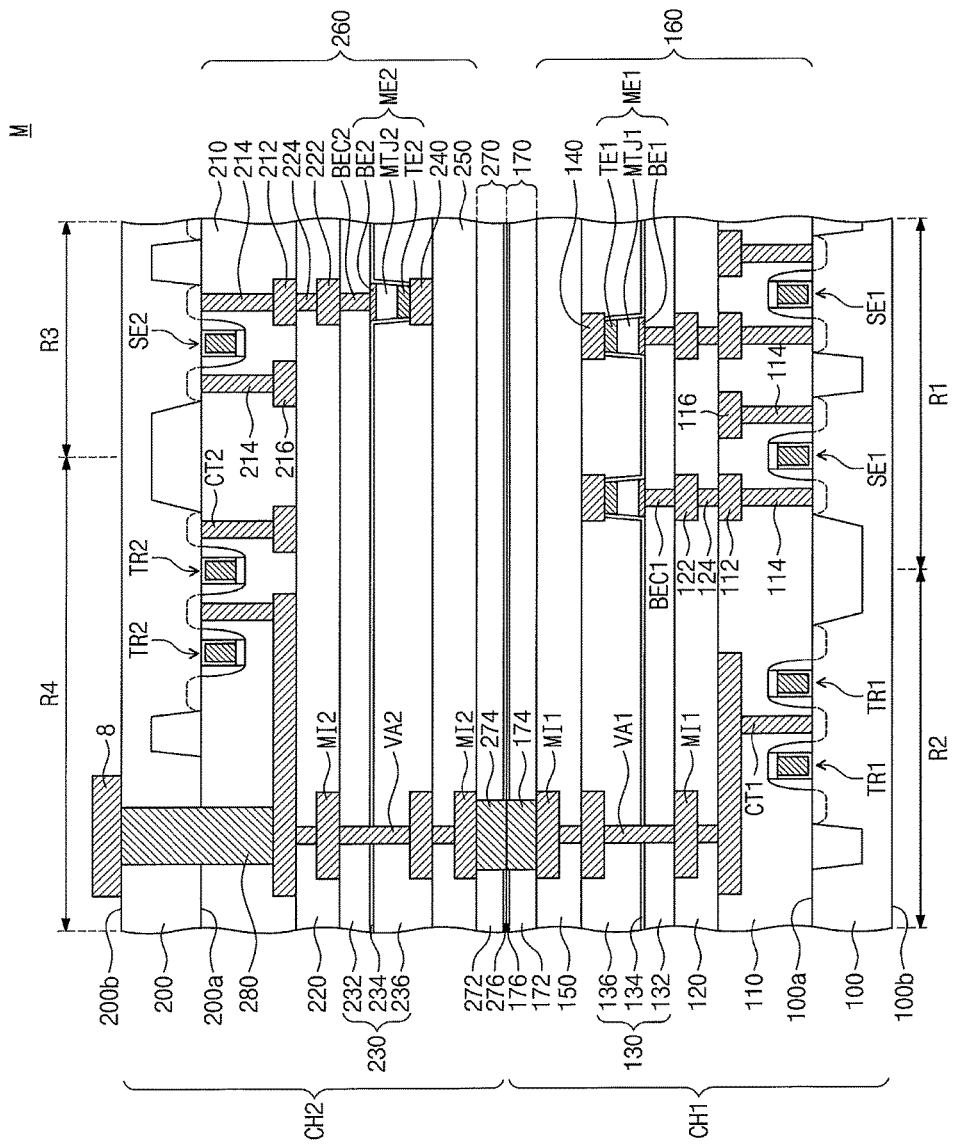
FIG. 7 is an enlarged cross-sectional view corresponding to section M of FIG. 6 for illustrating a chip stack as shown in FIG. 6 according to exemplary embodiments of the present inventive concepts.

FIG. 7 is an enlarged cross-sectional view corresponding to section M of FIG. 6 for illustrating a chip stack shown in FIG. 6. For brevity of the description, a repetitive explanation of elements described elsewhere herein will be omitted.

Referring to FIGS. 1, 6, and 7, the first semiconductor chip CH1 may include a first substrate 100, a first circuit layer 160 on the first substrate 100, and a first connecting layer 170 on the first circuit layer 160. The first substrate 100 may have a first surface 100a on which the first circuit layer 160 is disposed and a second surface 100b opposite to the first surface 100a. The second surface 100b of the first substrate 100 may be the same as the first surface 20a of the chip stack 20 discussed herein with reference to FIG. 6.

The first substrate 100 may include a first region R1 and a second region R2 different from each other. The first substrate 100 may have a portion corresponding to the first region R1 on which a first memory structure MS1 is provided, and also have other portion corresponding to the second region R2 on which a first logic structure LS1 is provided. In other words, in some embodiments, the first circuit layer 160 on the first region R1 may constitute the first memory structure MS1, and the first circuit layer 160 on the second region R2 may constitute the first logic structure LS1. The first surface 100a of the first substrate 100 may be provided thereon with interlayer dielectric layers 110, 120, 130, and 150 covering the first memory structure MS1 and the first logic structure LS1. The interlayer dielectric layers 110, 120, 130, and 150 may include first to third interlayer dielectric layers 110, 120, and 130 sequentially stacked and a first upper interlayer dielectric layer 150 on the third interlayer dielectric layer 130. The first upper interlayer dielectric layer 150 may be composed of a single layer or multiple layers, and may include silicon oxide, silicon nitride, and/or silicon oxynitride, or combinations thereof.

The first substrate 100 of the first region R1 may be provided with first select transistors SE1, first memory elements ME1, first and second conductive patterns 112 and 122, first cell contacts 114, first cell vias 124, first lower conductive lines 116, and first upper conductive lines 140 that constitute the first memory structure MS1. Configurations are discussed herein with reference to FIGS. 4A through 4C, and thus detailed descriptions thereof will be omitted.

The first substrate 100 of the second region R2 may be provided thereon with first logic transistors TR1 and a first routing structure that constitute the first logic structure LS1. The first logic transistors TR1 may constitute logic circuits for performing predetermined logic operations or peripheral circuits for driving memory cells. Each of the first logic transistors TR1 may include a gate electrode and impurity regions disposed on opposite sides of the gate electrode. The impurity regions may be areas where impurities are doped in the first substrate 100 of the second region R2. In addition, the first logic transistors TR1 may be adjacent to device isolation layers formed in the first substrate 100 of the second region R2. The first logic transistor TR1 is illustrated to have a planar gate structure, but embodiments of the present inventive concept are not limited thereto. In alternative embodiments, the first logic transistor TR1 may have a gate structure corresponding to that of a Fin-FET device. The first select transistor SE1 may have a structure substantially the same as or similar to that of the first logic transistor TR1.

The first routing structure may include a first metal line MI1, a first peripheral via VA1, and a first peripheral contact CT1. Each of the interlayer dielectric layers 110, 120, 130, and 150 may be provided therein with at least one first metal line MI1. The first peripheral via VA1 may connect vertically neighboring first metal lines MI1 to each other. The first peripheral contact CT1 may electrically connect the first metal line MI1 in the first interlayer dielectric layer 110 to one of the impurity regions of the first logic transistor TR1. The first metal line MI1 may include a material the same as those of the first and second conductive patterns 112 and 122 or those of the first lower and upper conductive lines 116 and 140, and the first peripheral via VA1 may include a material the same as those of the first cell vias 124. Likewise, the first peripheral contact CT1 may include a material the same as those of the first cell contacts 114. For example, the first metal line MI1, the first peripheral via VA1, and the first peripheral contact CT1 may each include metal (e.g., tungsten or copper) or conductive metal nitride (e.g., titanium nitride, tantalum nitride, or tungsten nitride), or other suitable conductive material.

The first connecting layer 170 may include a first base insulation layer 172, a first metal pad 174, and a first joint insulation layer 176. The first base insulation layer 172 may be disposed on the first upper interlayer dielectric layer 150. The first base insulation layer 172 may include silicon oxide or low-k dielectric (e.g., SiCOH, SiOF, etc.). The first metal pad 174 may be disposed in the first base insulation layer 172. The first base insulation layer 172 may surround the first metal pad 174. In addition, the first metal pad 174 may penetrate the first base insulation layer 172, and may be connected to at least one of the first metal lines MI1. For example, the first metal pad 174 may be directly connected to the first metal line MI1 positioned in the first upper interlayer dielectric layer 150. Accordingly, the first metal pad 174 may be electrically connected to the logic or peripheral circuit (i.e., the first logic transistors TR1) through the first metal lines MI1, the first peripheral vias VA1, and the first peripheral contact CT1. The first metal pad 174 may include copper, tungsten, aluminum, silver, or an alloy thereof, or other suitable pad material.

The first joint insulation layer 176 may be positioned on the first base insulation layer 172. The first joint insulation layer 176 may cover a top surface of the first base insulation layer 172 and expose the first metal pad 174. In some embodiments, the first joint insulation layer 176 may include SiN, SiCN, SiOCN, or SiC, or combinations thereof. The first joint insulation layer 176 may operate to prevent or minimize diffusion of a metallic component contained in the first metal pad 174.

The second semiconductor chip CH2 may have a structure similar to that of the first semiconductor chip CH1. For example, the second semiconductor chip CH2 may include a second substrate 200, a second circuit layer 260 on the second substrate 200, and a second connecting layer 270 on the second circuit layer 260. The second substrate 200 may have a third surface 200a on which the second circuit layer 260 is disposed and a fourth surface 200b opposite to the third surface 200a. The fourth surface 200b of the second substrate 200 may be the same as the second surface 20b of the chip stack 20 discussed with reference to FIG. 6. The second substrate 200 may include a third region R3 and a fourth region R4 that are different from each other. The second substrate 200 may have a portion corresponding to the third region R3 on which a second memory structure MS2 is provided, and also have other portion corresponding to the fourth region R4 on which a second logic structure LS2 is provided. In other words, the second circuit layer 260 on the third region R3 may constitute the second memory structure MS2, and the second circuit layer 260 on the fourth region R4 may constitute the second logic structure LS2 of the embodiment of FIG. 1.

The third surface 200a of the second substrate 200 may be provided thereon with interlayer dielectric layers 210, 220, 230, and 250 covering the second memory structure MS2 and the second logic structure LS2. The interlayer dielectric layers 210, 220, 230, and 250 may include fourth to sixth interlayer dielectric layers 210, 220, and 230 sequentially stacked and a second upper interlayer dielectric layer 250 on the sixth interlayer dielectric layer 230. The second upper interlayer dielectric layer 250 may be composed of a single layer or multiple layers, and may include silicon oxide, silicon nitride, and/or silicon oxynitride, or other suitable dielectric material.

The second substrate 200 of the third region R3 may be provided with second select transistors SE2, second memory elements ME2, third and fourth conductive patterns 212 and 222, second cell contacts 214, second cell vias 224, first lower conductive lines 216, and first upper conductive lines 240 that constitute the second memory structure MS2. Configurations of those above are already discussed with herein in connection with FIGS. 5A through 5C, and thus detailed descriptions of these similar elements will not be repeated herein.

The second substrate 200 of the fourth region R4 may be provided thereon with second logic transistors TR2 and a second routing structure that constitute the second logic structure LS2. The second logic transistors TR2 may constitute logic circuits for performing predetermined logic operations or peripheral circuits for driving memory cells. The second select transistor TR2 may have a structure substantially the same as or similar to that of the first logic transistor TR1. Each of the second logic transistors TR2 may include a gate electrode and impurity regions disposed on opposite sides of the gate electrode. The impurity regions may be areas where impurities are doped in the second substrate 200 of the fourth region R4. In addition, the second logic transistors TR2 may be adjacent to device isolation layers formed in the second substrate 200 of the fourth region R4. The second select transistor SE2 may have a structure substantially the same as or similar to that of the second logic transistor TR2.

The second routing structure may include a second metal line MI2, a second peripheral via VA2, and a second peripheral contact CT2. Each of the interlayer dielectric layers 210, 220, 230, and 250 may be provided therein with at least one second metal line MI2. The second peripheral via VA2 may connect vertically neighboring second metal lines MI2 to each other. The second peripheral contact CT2 may electrically connect the second metal line MI2 in the fourth interlayer dielectric layer 210 to one of the impurity regions of the second logic transistor TR2. The second metal line MI2 may include a material that is the same as those of the third and fourth conductive patterns 212 and 222 or those of the second lower and upper conductive lines 216 and 240, and the second peripheral via VA2 may include a material the same as those of the second cell vias 224. Likewise, the second peripheral contact CT2 may include a material the same as those of the second cell contacts 214. For example, the second metal line MI2, the second peripheral via VA2, and the second peripheral contact CT2 may each include metal (e.g., tungsten or copper) or conductive metal nitride (e.g., titanium nitride, tantalum nitride, or tungsten nitride).

The second connecting layer 270 may include a second base insulation layer 272, a second metal pad 274, and a second joint insulation layer 276. The second base insulation layer 272 may be disposed on the second upper interlayer dielectric layer 250. The second base insulation layer 272 may include silicon oxide or low-k dielectric (e.g., SiCOH, SiOF, etc.), or other suitable insulation material. The second metal pad 274 may be disposed in the second base insulation layer 272. The second base insulation layer 272 may surround the second metal pad 274. In addition, the second metal pad 274 may penetrate the second base insulation layer 272, and may then be connected to at least one of the second metal lines MI2. For example, the second metal pad 274 may be directly connected to the second metal line MI2 disposed in the second upper interlayer dielectric layer 250. Accordingly, the second metal pad 274 may be electrically connected to the logic or peripheral circuit (i.e., the second logic transistors TR2) through the second metal lines MI2, the second peripheral vias VA2, and the second peripheral contact CT2. In some embodiments, the second metal pad 274 may include copper, tungsten, aluminum, silver, or an alloy thereof.

The second joint insulation layer 276 may be disposed on the second base insulation layer 272. The second joint insulation layer 276 may cover a top surface of the second base insulation layer 272 and expose the second metal pad 274. The second joint insulation layer 276 may include SiN, SiCN, SiOCN, or SiC or other suitable insulation material. In some embodiments, the second joint insulation layer 276 may operate to prevent or minimize diffusion of a metallic component contained in the second metal pad 274.

The second semiconductor chip CH2 may further include at least one through via 280 penetrating the second substrate 200. The through via 280 may penetrate all of the third and fourth surfaces 200a and 200b of the second substrate 200. In addition, the through via 280 may further penetrate one or more (e.g., the fourth interlayer dielectric layer 210) of the interlayer dielectric layers 210, 220, 230, and 250, and may be connected to at least one of the second metal lines MI2. In some embodiments, the through via 280 may include a metallic material such as copper (Cu) or tungsten (W), or other suitable conductive material. The second metal pad 274 may be transmitted through the second metal lines MI2 and the second peripheral vias VA2 with an input/output (I/O) signal applied across the through via 280 by an external device (not shown).

The first semiconductor chip CH1 may be provided thereon with the second semiconductor chip CH2 in an inverted, face-to-face, position so that the first surface 100a of the first substrate 100 may face the third surface 200a of the second substrate 200. In this configuration, the first connecting layer 170 may face the second connecting layer 270. In addition, the first and second connecting layers 170 and 270 may be physically and electrically connected to each other so that the first and second semiconductor chips CH1 and CH2 may be electrically connected with each other. The first and second metal pads 174 and 274 may be aligned with and coupled to each other. Hence, the first and second semiconductor chips CH1 and CH2 may be electrically connected to each other to effect the electrical connection between chips CH1, CH2. Furthermore, the first and second joint insulation layers 176 and 276 may be in direct contact with, and coupled to, each other. As a result, the first and second semiconductor chips CH1 and CH2 may be directly electrically connected to each other without the need for connecting elements such as solder balls or solder bumps.

A method of fabricating a chip stack according to exemplary embodiments of the present inventive concept will now be described. FIGS. 8 to 11 are cross-sectional views for explaining a method of fabricating a chip stack according to exemplary embodiments of the present inventive concepts. For brevity of the description, description of repetitive elements will not be repeated.

Referring to FIG. 8, a plurality of transistors TR1 and SE1 may be formed on a first substrate 100 including a first region R1 and a second region R2. For example, first select transistors SE1 may be formed on the first region R1, and first logic transistors TR1 may be formed on the second region R2. In this description, a first surface 100a of the first substrate 100 may be an active surface, and a second surface 100b opposite to the first surface 100a may be an inactive surface.

A first interlayer dielectric layer 110 may be formed on the first surface 100a of the first substrate 100 and may thereby cover the plurality of transistors TR1 and SE1. First conductive patterns 112, first lower conductive lines 116, and first cell contacts 114 may be formed in the first interlayer dielectric layer 110 of the first region R1, and a first metal line MI1 and a first peripheral contact CT1 may be formed in the first interlayer dielectric layer 110 of the second region R2. In some embodiments, a damascene process may be employed to form the first conductive patterns 112, the first lower conductive lines 116, the first metal line MI1, and the first peripheral contact CT1 in the first interlayer dielectric layer 110.

A second interlayer dielectric layer 120 may be formed on the first interlayer dielectric layer 110; and second conductive patterns 122, first cell vias 124, a first metal line MI1, and a first peripheral via VA1 may be formed in the second interlayer dielectric layer 120. In some embodiments, a damascene process may be employed to form the second conductive patterns 122, the first metal line MI1, the first cell vias 124, and the first peripheral via VA1 in the second interlayer dielectric layer 120.

A first mold insulation layer 132 may be formed on the second interlayer dielectric layer 120 of the first and second regions R1 and R2, and first bottom electrode contacts BEC1 may be formed in the first mold insulation layer 132 of the first region R1. The first bottom electrode contacts BEC1 may be electrically connected to the second conductive patterns 122. For example, the first bottom electrode contacts BEC1 may be obtained by penetrating the first mold insulation layer 132 to form first bottom electrode contact holes through which the second conductive patterns 122 are exposed and then filling the first bottom electrode contact holes with a conductive material.

A first bottom electrode layer BEL1, a first magnetic tunnel junction layer MTJL1, and a first top electrode layer TEL1 may be sequentially formed on the first surface 100a of the first substrate 100. For example, the first magnetic tunnel junction layer MTJL1 may include a pinned layer, a tunnel barrier layer, and a free layer sequentially stacked on the first bottom electrode layer BEL1. The first bottom electrode layer BEL1, the pinned layer, the tunnel barrier layer, the free layer, and the first top electrode layer TEL1 may be respectively formed of the same materials as those of the first bottom electrode BE1, the pinned layer PL, the tunnel barrier layer TBL, the free layer FL, and the first top electrode TE1 discussed herein with reference to FIGS. 2A, 3A, 3B, and 4A.

Referring to FIG. 9, the first bottom electrode layer BEL1, the first magnetic tunnel junction layer MTJL1, and the first top electrode layer TEL1 may be patterned to form first memory elements ME1 on the first bottom electrode contacts BEC1. Each of the first memory elements ME1 may include a first bottom electrode BE1, a first magnetic tunnel junction MTJ1, and a first top electrode TE1 sequentially stacked on the first bottom electrode contact BEC1. The formation of the first memory elements ME1 may include forming a mask pattern (not shown) on the first top electrode layer TEL1 and performing an etching process in which the mask pattern is used as an etching mask. The etching process may include, for example, an ion beam etching process. During the formation of the first memory elements ME1, in order to achieve desired characteristics of the first magnetic tunnel junction MTJ1, the first magnetic tunnel junction layer MTJL1 may be adjusted in its size, material, and/or patterning condition.

A first protective layer 134 may be formed on the first mold insulation layer 132, thereby covering top surfaces and sidewalls of the first memory elements ME1. The first protective insulation layer 134 may be formed to prevent sidewalls of the first magnetic tunnel junction MTJ1 from being oxidized during a subsequent process. In some embodiments, the first protective insulation layer 134 may be formed of silicon nitride.

Figure 10:
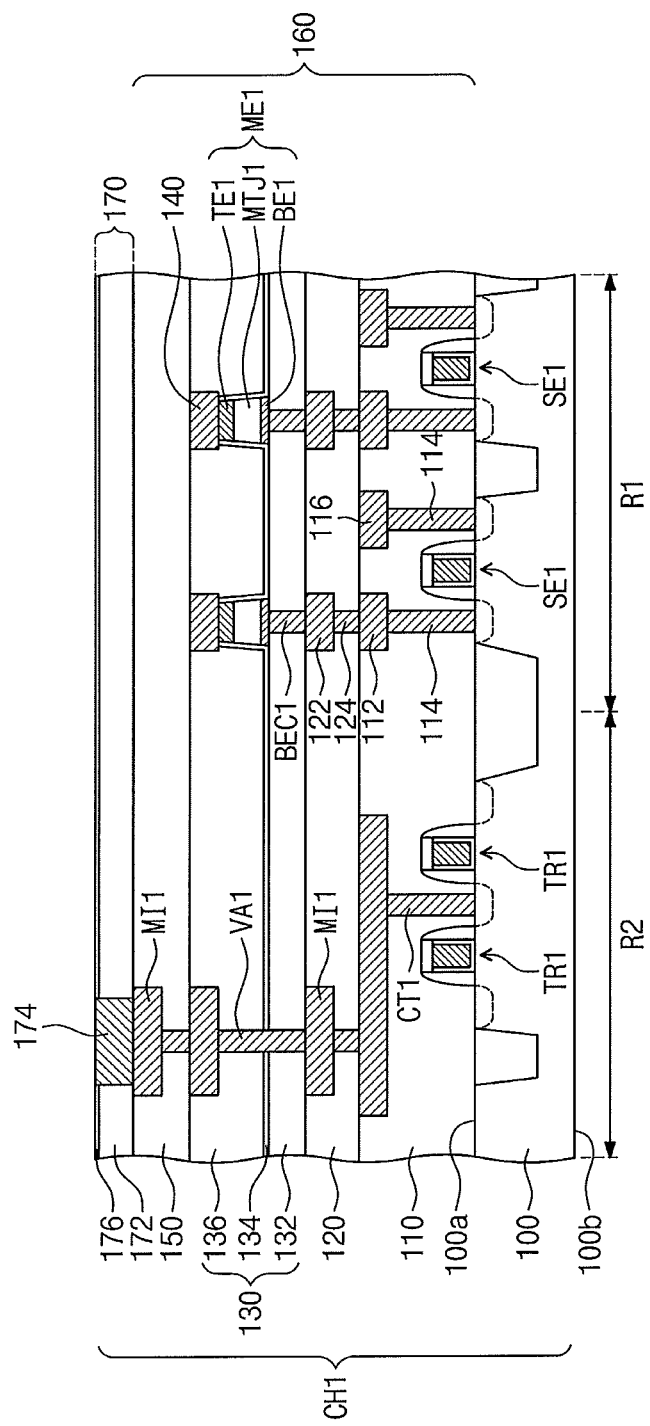

Referring to FIG. 10, a second mold insulation layer 136 may be formed to fill spaces between the first memory elements ME1 and to cover the first mold insulation layer 132. First upper conductive lines 140 coupled to the first top electrodes TE1 may be formed in the second mold insulation layer 136 of the first region R1, and a first metal line MI1 and a first peripheral via VA1 may be formed in the second mold insulation layer 136 of the second region R2. The first peripheral via VA1 in the second mold insulation layer 136 may penetrate the first protective insulation layer 134 and the first mold insulation layer 132, and may then be coupled to the first metal line MI1 in the second interlayer dielectric layer 120. A first upper interlayer dielectric layer 150 may be formed on the second mold insulation layer 136, and a first metal line MI1 and a first peripheral via VA1 may be formed in the first upper interlayer dielectric layer 150. Therefore, a first circuit layer 160 may be formed.

A first connecting layer 170 may be formed on the first circuit layer 160. The first connecting layer 170 may include a first base insulation layer 172 disposed on the first upper interlayer dielectric layer 150, a first metal pad 174 disposed in the first base insulation layer 172, and a first joint insulation layer 176 covering a top surface of the first base insulation layer 172 and exposing the first metal pad 174. In some embodiments, the formation of the first connecting layer 170 may include sequentially forming the first base insulation layer 172 and the first joint insulation layer 176 on the first upper interlayer dielectric layer 150, penetrating the first joint insulation layer 176 and the first base insulation layer 172 to form an opening that exposes the first metal line MI1 in the first upper interlayer dielectric layer 150, and forming the first metal pad 174 in the opening. The formation of the first connecting layer 170 may complete formation of a first semiconductor chip CH1.

Figure 11:
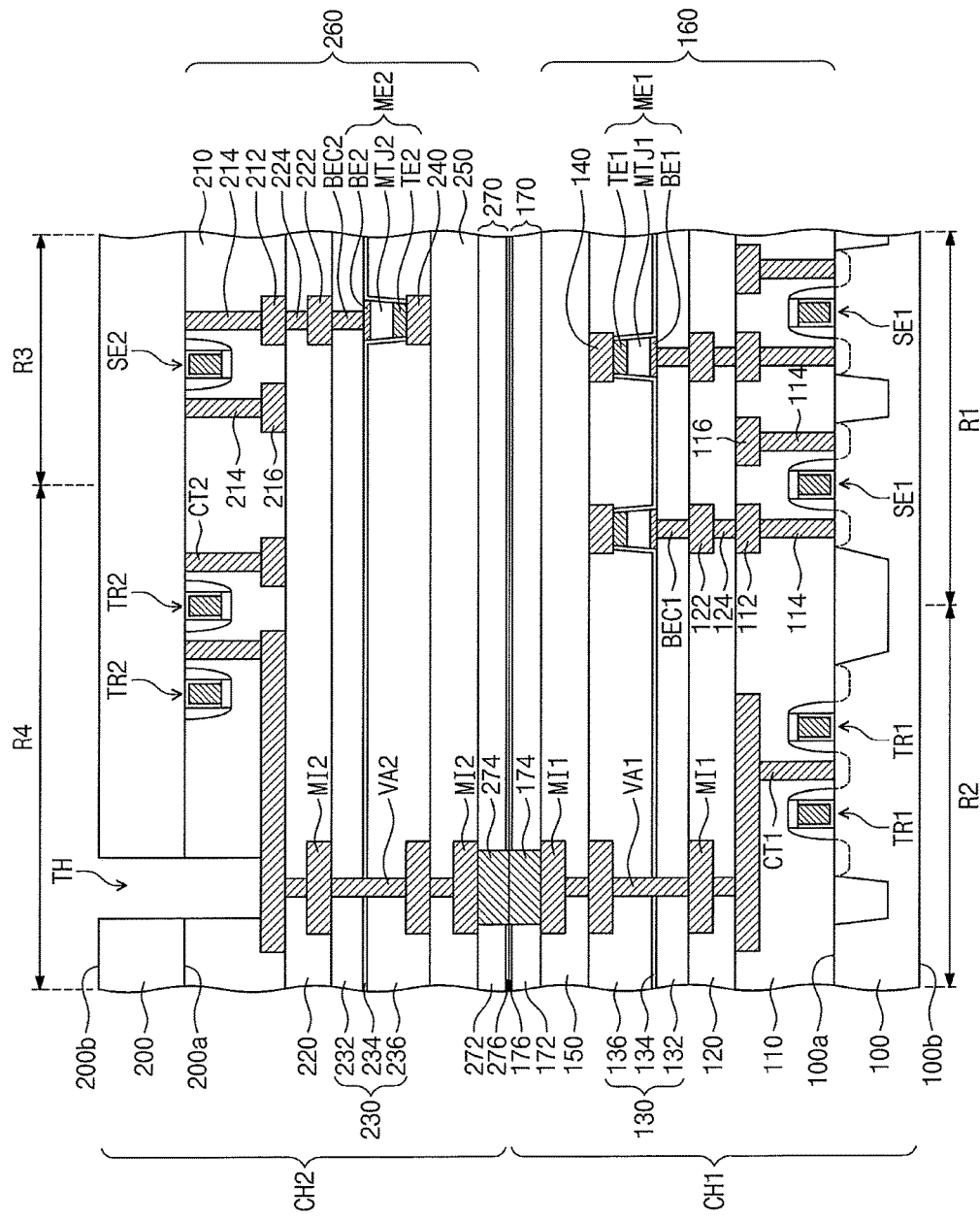

Referring to FIG. 11, a second semiconductor chip CH2 may be provided. The second semiconductor chip CH2 may include a second substrate 200 including a third region R3 and a fourth region R4, a second circuit layer 260 formed on the second substrate 200, and a second connecting layer 270 formed on the second circuit layer 260. In this description, a third surface 200a of the second substrate 200 may be an active surface, and a fourth surface 200b opposite to the third surface 200a may be an inactive surface. The second circuit layer 260 and the second connecting layer 270 may be respectively configured similar to the first circuit layer 160 and the first connecting layer 170, and may be respectively formed similarly to the first circuit layer 160 and the first connecting layer 170. The second circuit layer 260 and the second connecting layer 270 are explained in detail above with reference to FIG. 7, and thus repetitive descriptions thereof will be omitted.

The first and second semiconductor chips CH1 and CH2 may be stacked in such a way that the first surface 100a of the first substrate 100 faces the third surface 200a of the second substrate 200. That is, the second semiconductor chip CH2 may be turned over and then disposed on the first semiconductor chip CH1 so that the substrate surfaces 100a, 200a face each other. The first and second connecting layers 170 and 270 may similarly face each other. In this step, the first and second metal pads 174 and 274 may become aligned with and coupled to each other. Thereafter, a joining process (e.g., an annealing process) may be performed under high temperature and/or high pressure, so that the first and second connecting layers 170 and 270 may be firmly coupled to each other. In other words, the first and second joint insulation layers 176 and 276 may be in direct contact with each other, and therefore the first and second semiconductor chips CH1 and CH2 may be strongly adhered by direct connection therebetween.

A through hole TH may be formed to penetrate the second substrate 200. The through hole TH may penetrate all of the third and fourth surfaces 200a and 200b of the second substrate 200. In addition, the through hole TH may also penetrate the fourth interlayer dielectric layer 210, and thus the second metal line MI2 may be exposed through the through hole TH.

Referring back to FIG. 7, the through hole TH may be filled with a metallic material (e.g., copper (Cu) or tungsten (W) or other suitable conductive material) to form a through via 280. A bonding pad 8 may be formed on the through via 280. Hence, the fourth surface 200b of the second substrate 200 may be provided thereon with the bonding pad 8 electrically connected to the through via 280. In this way, a first chip stack 20 may be formed.

Figure 12:
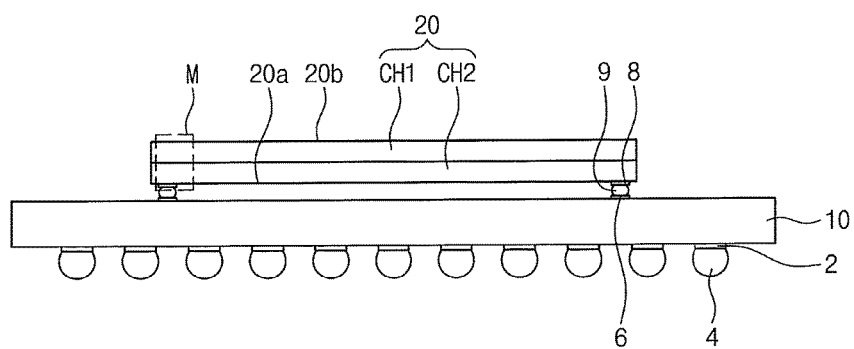
FIG. 12 is a cross-sectional view illustrating a semiconductor package according to exemplary embodiments of the present inventive concepts.
Figure 13:
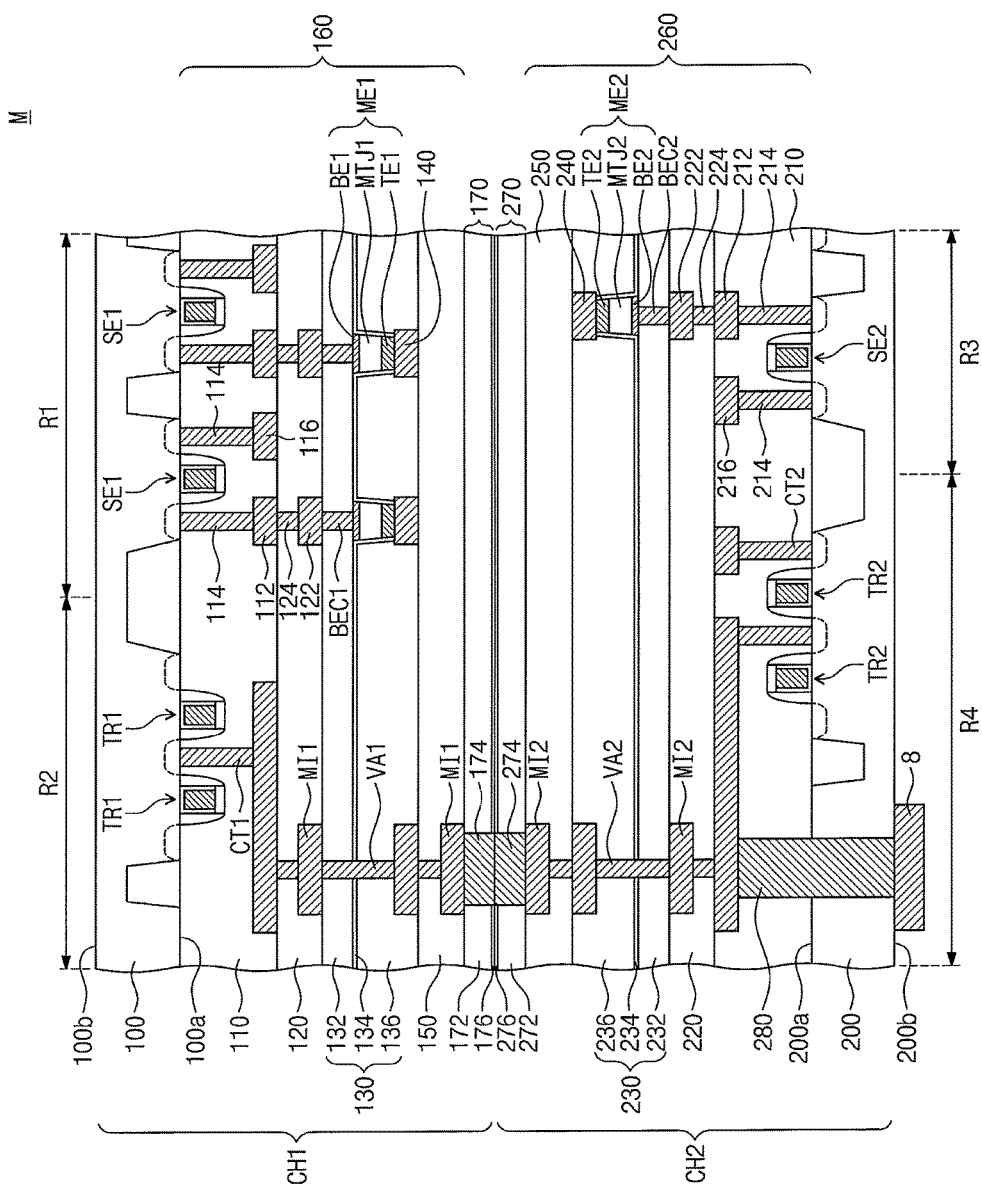
FIG. 13 is an enlarged cross-sectional view corresponding to section M of FIG. 12 for illustrating a chip stack shown in FIG. 12 according to exemplary embodiments of the present inventive concepts.

FIG. 12 is a cross-sectional view illustrating a semiconductor package according to exemplary embodiments of the present inventive concepts. FIG. 13 is an enlarged cross-sectional view corresponding to section M of FIG. 12 for explaining a chip stack shown in FIG. 12. In the embodiment that follows, omission will be made to avoid repetitive description of similar technical features of the semiconductor package and the chip stack discussed herein with reference to FIGS. 6 and 7, and differences therebetween will be described in detail.

Referring to FIGS. 12 and 13, the chip stack 20 may be mounted on the package substrate 10. The chip stack 20 may include the first semiconductor chip CH1 and the second semiconductor chip CH2 that are vertically stacked. In some embodiments, the chip stack 20 may include the first and second semiconductor chips CH1 and CH2 that are physically and electrically connected to each other in a wafer-on-wafer fabrication process. In the present embodiment, the chip stack 20 may be mounted on the package substrate 10 so as to cause the second semiconductor chip CH2 to be positioned close to the package substrate 10. For example, differently from those shown in FIGS. 6 and 7, the chip stack 20 may be electrically connected through connecting terminals 9 to the package substrate 10. The connecting terminal 9 may include a conductive material and have a solder or bump shape. The first surface 20a (i.e., the fourth surface 200b of the second substrate 200) of the chip stack 20 may be provided thereon with the bonding pads 8 each coupled to the through via 280. The bonding pads 8 may be electrically connected through the connecting terminals 9 to the second outer connecting pads 6 of the package substrate 10. Other configurations may be identical or similar to those discussed with reference to FIGS. 6 and 7.

Figure 14:
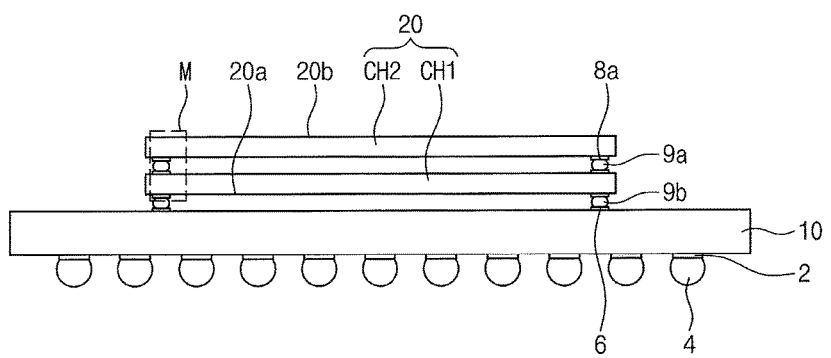
FIG. 14 is a cross-sectional view showing a semiconductor package according to exemplary embodiments of the present inventive concepts.
Figure 15:
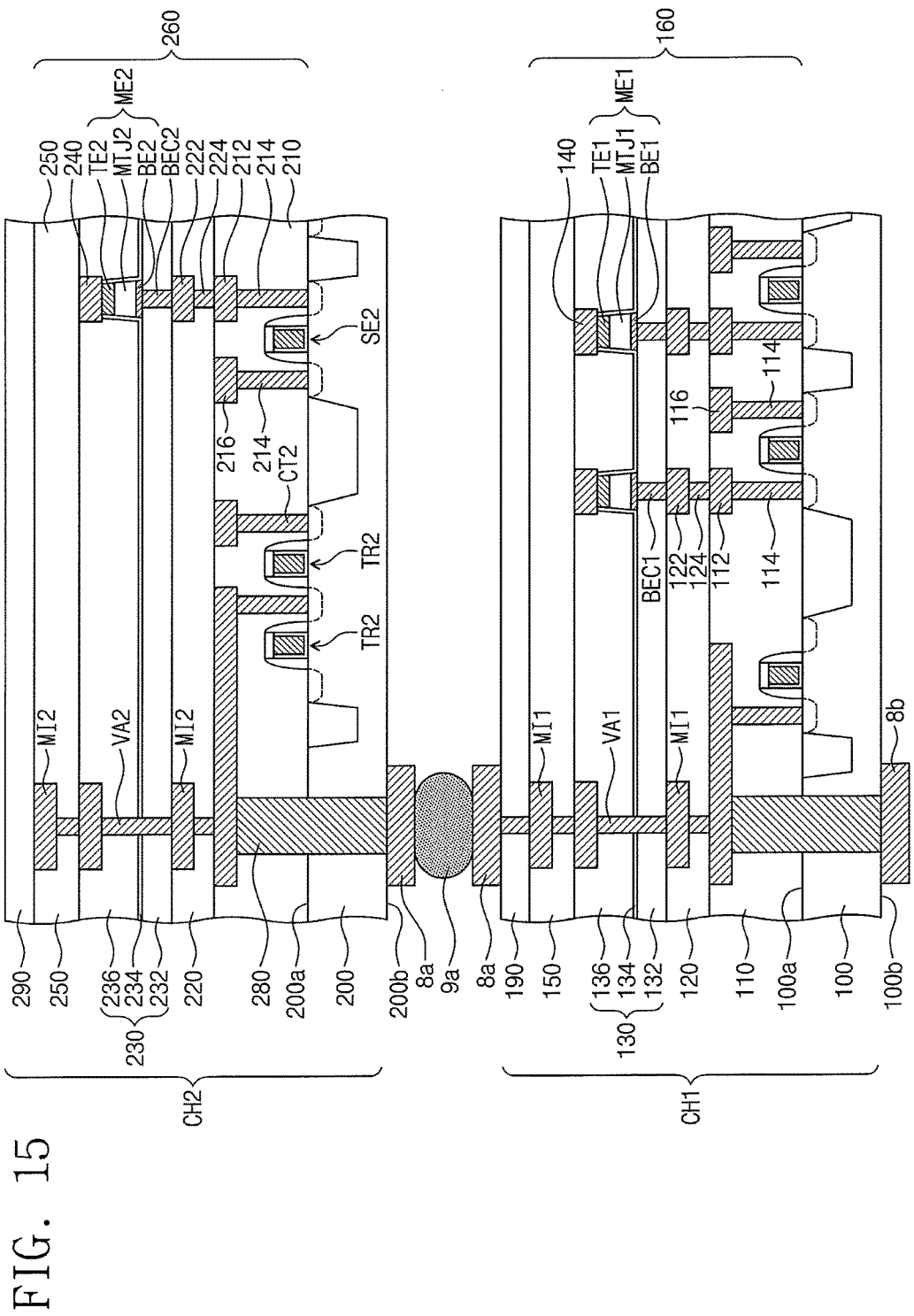
FIG. 15 is an enlarged cross-sectional view corresponding to section M of FIG. 14 for illustrating a chip stack according to exemplary embodiments of the present inventive concepts.

FIG. 14 is a cross-sectional view showing a semiconductor package according to exemplary embodiments of the present inventive concept. FIG. 15 is an enlarged cross-sectional view corresponding to section M of FIG. 14 for explaining a chip stack according to exemplary embodiments of the present inventive concept. In the embodiment that follows, omission will be made to avoid description about repetitive technical features of the semiconductor package and the chip stack discussed above with reference to FIGS. 6 and 7, and differences therebetween will be described in detail.

Referring to FIGS. 14 and 15, the chip stack 20 may be mounted on the package substrate 10. The chip stack 20 may include the first semiconductor chip CH1 and the second semiconductor chip CH2 that are vertically stacked. The first and second semiconductor chips CH1 and CH2 may each include at least one through via (i.e., 180 and 280, respectively), and may be electrically connected to each other in a chip-on-wafer or chip-on-chip fabrication process. In a chip on wafer process, individual second chips may be diced and aligned and coupled to first chips that are still in a wafer arrangement. Following this, the individual chip stacks may be diced. In a chip-on-chip fabrication process, the individual first and second chips may both be diced, aligned and coupled to each other to form chip stacks. For example, the first and second semiconductor chips CH1 and CH2 may be electrically connected to each other through first connecting terminals 9a. The chip stack 20 may be electrically connected through second connecting terminals 9b to the package substrate 10. The first and second connecting terminals 9a and 9b may include a conductive material and have a solder or bump shape. First bonding pads 8a may be disposed between the first connecting terminals 9a and the first semiconductor chip CH1 and between ones of the first connecting terminals 9a. Second bonding pads 8b may be disposed on the first surface 20a (i.e., the second surface 100b of the first substrate 100) of the chip stack 20. The second bonding pads 8b may be electrically connected through the second connecting terminals 9b to the second outer connecting pads 6 of the package substrate 10. Different than the configuration depicted in FIGS. 6 and 7, in the present configuration a first passivation layer 190 may be disposed on the first circuit layer 160, and a second passivation layer 290 may be disposed on the second circuit layer 260. The first and second passivation layers 190 and 290 may include, for example, silicon nitride or other suitable passivation material. The first passivation layer 190 may be provided therein with a first peripheral via VA1 that connects the first bonding pad 8a to the first metal line MI1 in the first upper interlayer dielectric layer 150. Other configurations may be identical or similar to those discussed with reference to FIGS. 6 and 7.

Although the inventive concepts have been described in connection with the embodiments of the present invention illustrated in the accompanying drawings, it will be understood to those skilled in the art that various changes and modifications may be made without departing from the technical spirit and essential feature of the inventive concepts. It will be apparent to those skilled in the art that various substitution, modifications, and changes may be thereto without departing from the scope and spirit of the inventive concepts.

What is claimed is:

1. A semiconductor device comprising:
   a first semiconductor chip comprising a first substrate and a first magnetic tunnel junction on the first substrate, and
   a second semiconductor chip comprising a second substrate and a second magnetic tunnel junction on the second substrate, the second semiconductor chip on the first semiconductor chip to form a chip stack,
   wherein a first critical current density required for magnetization reversal of the first magnetic tunnel junction is different than a second critical current density required for magnetization reversal of the second magnetic tunnel junction.

2. The semiconductor device of claim 1, wherein
   the first magnetic tunnel junction comprises a first pinned layer, a first tunnel barrier layer, and a first free layer that are sequentially stacked on the first substrate,
   the second magnetic tunnel junction comprises a second pinned layer, a second tunnel barrier layer, and a second free layer that are sequentially stacked on the second substrate, and
   the first critical current density is greater than the second critical current density.

3. The semiconductor device of claim 2, wherein
   the first magnetic tunnel junction comprises a first memory cell of the first semiconductor chip, and
   the second magnetic tunnel junction comprises a second memory cell of the second semiconductor chip,
   wherein the first memory cell operates as a non-volatile memory (NVM) cell, and the second memory cell operates as a random access memory (RAM) cell.

4. The semiconductor device of claim 2, wherein the first free layer of the first magnetic tunnel junction has a volume greater than a volume of the second free layer of the second magnetic tunnel junction.

5. The semiconductor device of claim 4, wherein the first free layer has a first width greater than a second width of the second free layer.

6. The semiconductor device of claim 4, wherein the first free layer has a first thickness greater than a second thickness of the second free layer.

7. The semiconductor device of claim 2, wherein the first free layer comprises a material having a saturation magnetization that is greater than a saturation magnetization of a material of the second free layer.

8. The semiconductor device of claim 2, wherein
   the first magnetic tunnel junction further comprises a first sub-oxide layer on the first free layer, and
   the second magnetic tunnel junction further comprises a second sub-oxide layer on the second free layer,
   wherein the first sub-oxide layer has a third thickness greater than a fourth thickness of the second sub-oxide layer.

9. The semiconductor device of claim 1, wherein
   the first substrate comprises a first region where the first magnetic tunnel junction is positioned and a second region different from the first region, and
   the second substrate comprises a third region where the second magnetic tunnel junction is disposed and a fourth region different from the third region,
   wherein the first semiconductor chip further comprises:
      a first select transistor at the first region and electrically connected to the first magnetic tunnel junction;
      a first logic transistor at the second region; and
      a first routing structure at the second region and electrically connected to the first logic transistor, and wherein the second semiconductor chip further comprises:
a second select transistor at the third region and electrically connected to the second magnetic tunnel junction;
a second logic transistor at the fourth region; and
a second routing structure at the fourth region and electrically connected to the second logic transistor.

10. The semiconductor device of claim 9, wherein
the first semiconductor chip further comprises a first connecting layer including a first metal pad electrically connected to the first routing structure, and
the second semiconductor chip further comprises a second connecting layer including a second metal pad electrically connected to the second routing structure,
wherein the first and second connecting layers face each other and the first and second metal pads are in contact with each other such that the first and second semiconductor chips are electrically connected to each other.

11. A semiconductor device comprising:
a first semiconductor chip; and
a second semiconductor chip stacked on the first semiconductor chip in a chip stack arrangement,
wherein the first semiconductor chip comprises:
a first substrate including a first region and a second region;
a first memory structure at the first region; and
a first logic structure at the second region, and
wherein the second semiconductor chip comprises:
a second substrate including a third region and a fourth region;
a second memory structure at the third region; and
a second logic structure at the fourth region,
wherein the first memory structure comprises a first memory cell operable as a non-volatile memory (NVM) cell, and the second memory structure comprises a second memory cell operable as a random access memory (RAM) cell.

12. The semiconductor device of claim 11, wherein
the first memory cell comprises a first magnetic tunnel junction having a first pinned layer, a first tunnel barrier layer, and a first free layer that are sequentially stacked at the first region, and
the second memory cell comprises a second magnetic tunnel junction having a second pinned layer, a second tunnel barrier layer, and a second free layer that are sequentially stacked at the third region,
wherein a first critical current density required for magnetization reversal of the first magnetic tunnel junction is greater than a second critical current density required for magnetization reversal of the second magnetic tunnel junction.

13. The semiconductor device of claim 12, wherein
the first free layer has a first width greater than a second width of the second free layer, or
the first free layer has a first thickness greater than a second thickness of the second free layer.

14. The semiconductor device of claim 12, wherein the first free layer comprises a material a saturation magnetization of which is greater than a saturation magnetization of a material of the second free layer.

15. The semiconductor device of claim 12, wherein
the first magnetic tunnel junction further comprises a first sub-oxide layer on the first free layer, and
the second magnetic tunnel junction further comprises a second sub-oxide layer on the second free layer,
wherein the first sub-oxide layer has a third thickness greater than a fourth thickness of the second sub-oxide layer.

16. A semiconductor device comprising:
a first semiconductor chip comprising a first substrate extending in a horizontal direction and a first magnetic tunnel junction on the first substrate, and
a second semiconductor chip comprising a second substrate extending in the horizontal direction and a second magnetic tunnel junction on the second substrate, the second semiconductor chip positioned on the first semiconductor chip to form a chip stack extending in a vertical direction relative to the horizontal direction,
wherein the first magnetic tunnel junction has a first critical current density required for magnetization reversal of the first magnetic tunnel junction,
wherein the second magnetic tunnel junction has a second critical current density required for magnetization reversal of the second magnetic tunnel junction, and
wherein the first and second critical current densities required for magnetization reversal are different.

17. The semiconductor device of claim 16, wherein
the first magnetic tunnel junction comprises a first pinned layer, a first tunnel barrier layer, and a first free layer that are sequentially stacked on the first substrate,
the second magnetic tunnel junction comprises a second pinned layer, a second tunnel barrier layer, and a second free layer that are sequentially stacked on the second substrate, and
the first critical current density is greater than the second critical current density.

18. The semiconductor device of claim 17, wherein the first free layer has a volume greater than a volume of the second free layer.

19. The semiconductor device of claim 17, wherein the first free layer comprises a material having a saturation magnetization that is greater than a saturation magnetization of a material of the second free layer.

20. The semiconductor device of claim 16, wherein
the first magnetic tunnel junction comprises a first memory cell of the first semiconductor chip, and
the second magnetic tunnel junction comprises a second memory cell of the second semiconductor chip,
wherein the first memory cell operates as a non-volatile memory (NVM) cell, and the second memory cell operates as a random access memory (RAM) cell.

* * * * *